(12) United States Patent
Kim et al.

(10) Patent No.: US 11,211,370 B2
(45) Date of Patent: Dec. 28, 2021

(54) BONDED ASSEMBLY WITH VERTICAL POWER AND CONTROL SIGNAL CONNECTION ADJACENT TO SENSE AMPLIFIER REGIONS AND METHODS OF FORMING THE SAME

(71) Applicant: SANDISK TECHNOLOGIES LLC, Addison, TX (US)

(72) Inventors: Jee-Yeon Kim, San Jose, CA (US); Yuki Mizutani, San Jose, CA (US); Fumiaki Toyama, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 12 days.

(21) Appl. No.: 16/774,372

(22) Filed: Jan. 28, 2020

(65) Prior Publication Data
US 2021/0233900 A1 Jul. 29, 2021

(51) Int. Cl.
*H01L 25/18* (2006.01)
*H01L 23/48* (2006.01)
*H01L 25/00* (2006.01)
*H01L 27/06* (2006.01)

(52) U.S. Cl.
CPC ............ *H01L 25/18* (2013.01); *H01L 23/481* (2013.01); *H01L 25/50* (2013.01); *H01L 27/0688* (2013.01)

(58) Field of Classification Search
CPC ....... H01L 23/481; H01L 25/18; H01L 25/50; H01L 27/0688
See application file for complete search history.

(56) References Cited

U.S. PATENT DOCUMENTS

| | | |
|---|---|---|
| 5,915,167 A | 6/1999 | Leedy |
| 8,378,892 B2 | 2/2013 | Sorvala et al. |
| 10,115,681 B1 | 10/2018 | Ariyoshi |
| 10,283,493 B1 | 5/2019 | Nishida |
| 10,354,980 B1 | 7/2019 | Mushiga et al. |
| 10,354,987 B1 | 7/2019 | Mushiga et al. |
| 10,381,322 B1 | 8/2019 | Azuma et al. |
| 10,381,362 B1 | 8/2019 | Cui et al. |
| 10,510,738 B2 | 12/2019 | Kim et al. |
| 2007/0147161 A1 | 6/2007 | Cho et al. |

(Continued)

FOREIGN PATENT DOCUMENTS

CN 110546762 A 12/2019

OTHER PUBLICATIONS

U.S. Appl. No. 16/231,752, filed Dec. 24, 2018, SanDisk Technologies LLC.

(Continued)

*Primary Examiner* — Herve-Louis Y Assouman
(74) *Attorney, Agent, or Firm* — The Marbury Law Group PLLC

(57) ABSTRACT

A bonded assembly includes a memory die containing a memory device and a plurality of bit lines, and logic die bonded to the memory die. The logic die contains a control circuit configured to control operation of the memory device. The control circuit contains a peripheral circuit region, a sense amplifier region, and a power and control signal region located adjacent to the sense amplifier region and containing at least one power and control signal interconnect structure which is configured to provide a power or control signal to or from the peripheral circuit region.

9 Claims, 15 Drawing Sheets

(56) References Cited

U.S. PATENT DOCUMENTS

| | | | |
|---|---|---|---|
| 2008/0088511 A1 | 4/2008 | Sorvala et al. | |
| 2009/0290416 A1* | 11/2009 | Abe | H01L 27/11521 365/185.05 |
| 2016/0035707 A1* | 2/2016 | Hua | H01L 23/3171 257/737 |
| 2016/0365352 A1* | 12/2016 | Nishikawa | H01L 21/32055 |
| 2019/0019838 A1 | 1/2019 | Kropelnicki et al. | |
| 2019/0221557 A1* | 7/2019 | Kim | H01L 25/50 |
| 2019/0252361 A1 | 8/2019 | Nishida | |

OTHER PUBLICATIONS

U.S. Appl. No. 16/242,216, filed Jan. 8, 2019, SanDisk Technologies LLC.
U.S. Appl. No. 16/248,923, filed Jan. 16, 2019, SanDisk Technologies LLC.
U.S. Appl. No. 16/249,423, filed Jan. 16, 2019, SanDisk Technologies LLC.
U.S. Appl. No. 16/255,413, filed Jan. 23, 2019, SanDisk Technologies LLC.
U.S. Appl. No. 16/269,301, filed Feb. 6, 2019, SanDisk Technologies LLC.
U.S. Appl. No. 16/274,687, filed Feb. 13, 2019, SanDisk Technologies LLC.
U.S. Appl. No. 16/275,668, filed Feb. 14, 2019, SanDisk Technologies LLC.
U.S. Appl. No. 16/278,372, filed Feb. 18, 2019, SanDisk Technologies LLC.
U.S. Appl. No. 16/284,502, filed Feb. 25, 2019, SanDisk Technologies LLC.
U.S. Appl. No. 16/288,656, filed Feb. 28, 2019, SanDisk Technologies LLC.
U.S. Appl. No. 16/291,457, filed Mar. 4, 2019, SanDisk Technologies LLC.
U.S. Appl. No. 16/291,504, filed Mar. 4, 2019, SanDisk Technologies LLC.
U.S. Appl. No. 16/291,577, filed Mar. 4, 2019, SanDisk Technologies LLC.
U.S. Appl. No. 16/295,292, filed Mar. 7, 2019, SanDisk Technologies LLC.
U.S. Appl. No. 16/372,908, filed Apr. 2, 2019, SanDisk Technologies LLC.
U.S. Appl. No. 16/385,010, filed Apr. 16, 2019, SanDisk Technologies LLC.
U.S. Appl. No. 16/391,632, filed Apr. 23, 2019, SanDisk Technologies LLC.
U.S. Appl. No. 16/404,844, filed May 7, 2019, SanDisk Technologies LLC.
U.S. Appl. No. 16/404,961, filed May 7, 2019, SanDisk Technologies LLC.
U.S. Appl. No. 16/409,593, filed May 10, 2019, SanDisk Technologies LLC.
U.S. Appl. No. 16/417,913, filed May 21, 2019, SanDisk Technologies LLC.
U.S. Appl. No. 16/440,183, filed Jun. 13, 2019, SanDisk Technologies LLC.
U.S. Appl. No. 16/521,849, filed Jul. 25, 2019, SanDisk Technologies LLC.
U.S. Appl. No. 16/523,029, filed Jul. 26, 2019, SanDisk Technologies LLC.
U.S. Appl. No. 16/547,971, filed Aug. 22, 2019, SanDisk Technologies LLC.
U.S. Appl. No. 16/552,089, filed Aug. 27, 2019, SanDisk Technologies LLC.
U.S. Appl. No. 16/589,404, filed Oct. 1, 2019, SanDisk Technologies LLC.
U.S. Appl. No. 16/660,177, filed Oct. 22, 2019, SanDisk Technologies LLC.
U.S. Appl. No. 16/666,522, filed Oct. 29, 2019, SanDisk Technologies LLC.
U.S. Appl. No. 16/671,025, filed Oct. 31, 2019, SanDisk Technologies LLC.
U.S. Appl. No. 16/675,459, filed Nov. 6, 2019, SanDisk Technologies LLC.
U.S. Appl. No. 16/682,848, filed Nov. 13, 2019, SanDisk Technologies LLC.
U.S. Appl. No. 16/694,340, filed Nov. 25, 2019, SanDisk Technologies LLC.
U.S. Appl. No. 16/694,400, filed Nov. 25, 2019, SanDisk Technologies LLC.
U.S. Appl. No. 16/694,438, filed Nov. 25, 2019, SanDisk Technologies LLC.
U.S. Appl. No. 16/728,327, filed Dec. 27, 2019, SanDisk Technologies LLC.
U.S. Appl. No. 16/742,213, filed Jan. 14, 2020, SanDisk Technologies LLC.
U.S. Appl. No. 16/747,943, filed Jan. 21, 2020, SanDisk Technologies LLC.
Notification of Transmittal of the International Search Report and Written Opinion of the International Search Authority tor International Patent Application No. PCT/US2020/035132, dated Sep. 17, 2020, 12 pages.

\* cited by examiner

BONDED ASSEMBLY WITH VERTICAL POWER AND CONTROL SIGNAL CONNECTION ADJACENT TO SENSE AMPLIFIER REGIONS AND METHODS OF FORMING THE SAME

FIELD

The present disclosure relates generally to the field of semiconductor devices, and particularly to a bonded assembly of semiconductor dies containing vertical power and control signal connection adjacent to the sense amplifier region and methods for forming the same.

BACKGROUND

A bonded assembly of a memory die and a logic die can provide a high performance three-dimensional memory device. The logic die can include a control circuit for controlling operation of a three-dimensional memory array within the memory die.

SUMMARY

According to an embodiment of the present disclosure, a bonded assembly includes a memory die containing a memory device and a plurality of bit lines, and logic die bonded to the memory die. The logic die contains a control circuit configured to control operation of the memory device. The control circuit contains a peripheral circuit region, a sense amplifier region, and a power and control signal region located adjacent to the sense amplifier region and containing at least one power and control signal interconnect structure which is configured to provide a power or control signal to or from the peripheral circuit region.

According to another aspect of the present disclosure, a method of forming a bonded assembly comprises providing a memory die comprising memory devices and bit lines, providing a logic die containing control circuit configured to control operation of the memory device, wherein the control circuit comprises a peripheral circuit region, a sense amplifier region, and a power and control signal region located adjacent to the sense amplifier region and containing at least one power and control signal interconnect structure which is configured to provide a power or control signal to or from the peripheral circuit region, and bonding the logic die to the memory die.

DETAILED DESCRIPTION

Figure 1A:
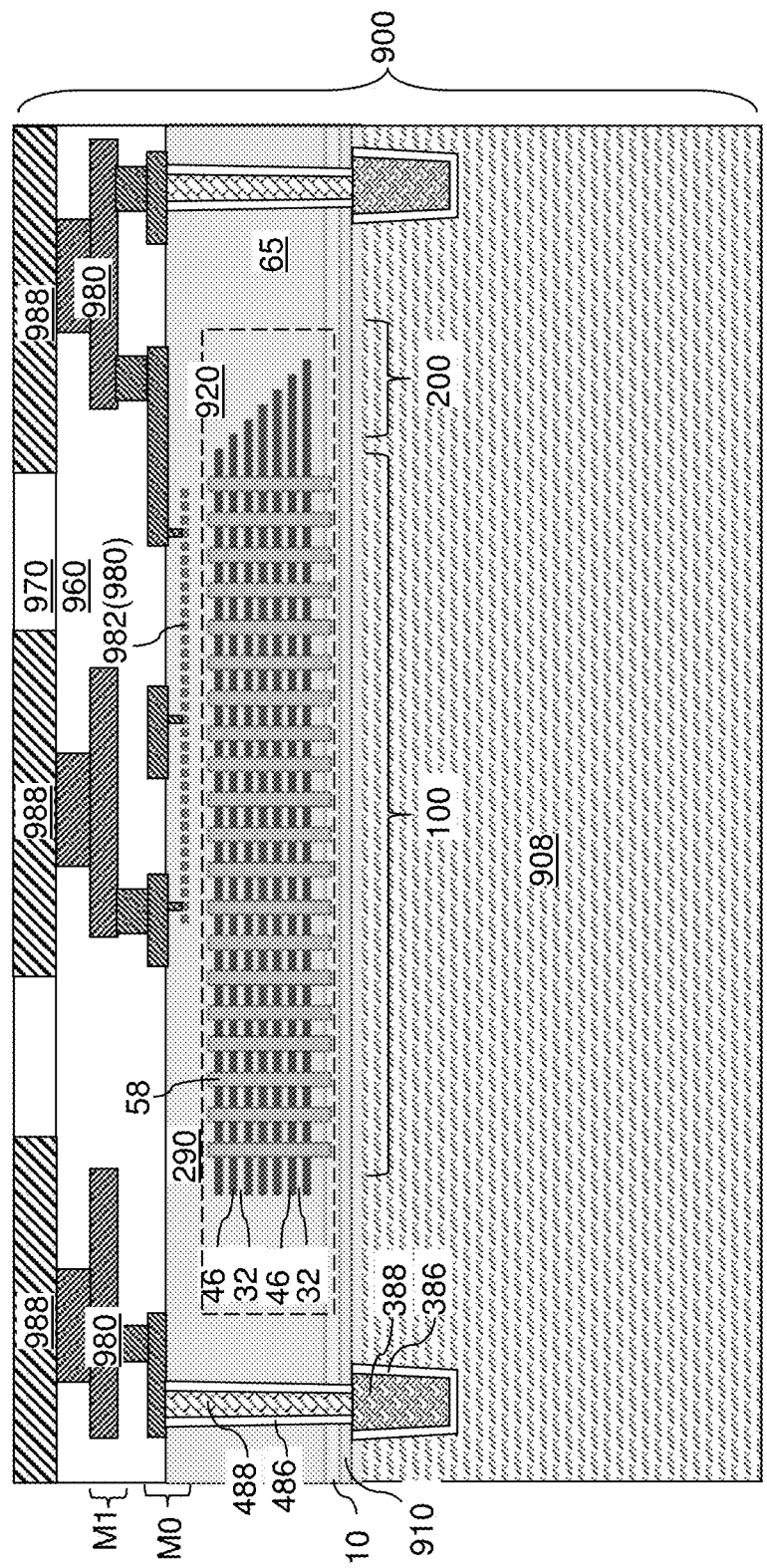
FIG. 1A is a schematic vertical cross-sectional view of a memory die in a first configuration after formation of a memory-side bonding dielectric layer and memory-side bonding pads according to an embodiment of the present disclosure.

Interconnection between the logic and memory dies includes several vertical levels of metal routing, which adds to the total production cost for the bonded assembly. As discussed above, the embodiments of the present disclosure are directed to a bonded assembly of semiconductor dies containing vertical power and control signal connection adjacent to the sense amplifier region and methods for forming the same, the various aspects of which are described in detail below. The vertical power and control signal connection may be located between two sense amplifier regions and/or under the terrace (i.e., staircase) region in a word line switch region adjacent to a sense amplifier region. These vertical connection locations may eliminate one additional vertical level of metal interconnections, which simplifies the process and reduces the production cost for the device.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0\times10^{-5}$ S/m to $1.0\times10^5$ S/m. As used herein, a "semiconductor material" refers to a material having electrical conductivity in the range from $1.0\times10^{-5}$ S/m to $1.0$ S/m in the absence of electrical dopants therein, and is capable of producing a doped material having electrical conductivity in a range from $1.0$ S/m to $1.0\times10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Figure 1B:
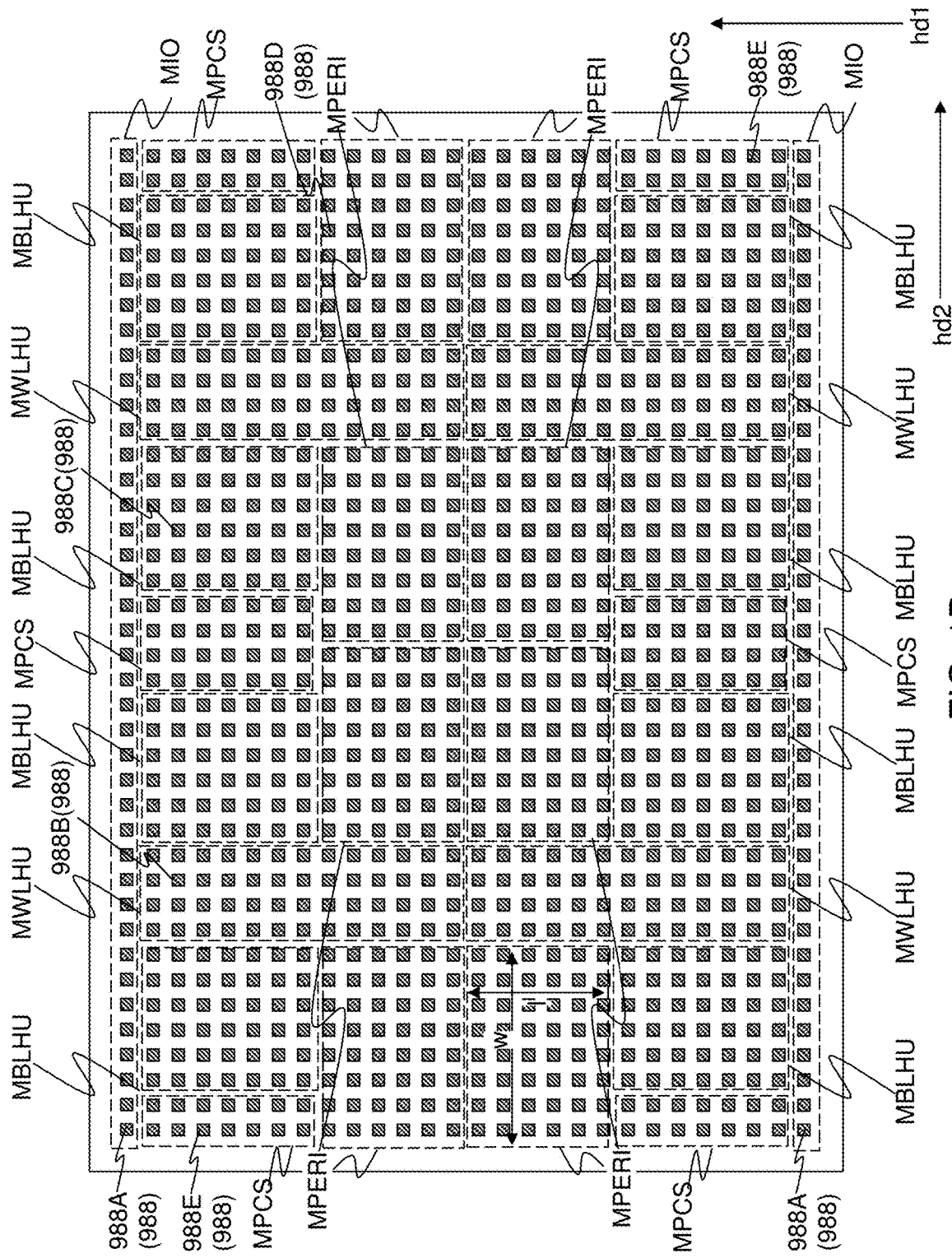
FIG. 1B is a top-down view of the memory die of FIG. 1A.

Referring to FIGS. 1A and 1B, a first semiconductor die 900 according to an embodiment of the present disclosure is illustrated. The first semiconductor die 900 includes a first substrate 908, first semiconductor devices 920 overlying the first substrate 908, first dielectric material layers (290, 960, 970) overlying the first semiconductor devices, and first metal interconnect structures 980 embedded in the first dielectric material layers (290, 960, 970). In one embodiment, the first substrate 908 may be a commercially available silicon wafer having a thickness in a range from 500 microns to 1 mm.

Discrete substrate recess cavities can be formed in an upper portion of the first substrate 908 by applying a photoresist layer over the top surface of the first substrate 908, lithographically patterning the photoresist layer to form an array of discrete openings, and transferring the pattern of the array of discrete openings into the upper portion of the first substrate by performing an anisotropic etch process. The photoresist layer can be subsequently removed, for example, by ashing. The depth of each discrete substrate recess cavity can be in a range from 500 nm to 10,000, although lesser and greater depths can also be employed. A dielectric through-substrate liner 386 (e.g., silicon oxide liner) and an electrically conductive through-substrate via structure 388 (e.g., tungsten via structure) can be formed within each discrete substrate recess cavity.

Generally, the first semiconductor devices 920 may comprise any semiconductor device known in the art. In one embodiment, the first semiconductor die 900 comprises a memory die, and may include memory devices, such as a three-dimensional NAND memory device. In an illustrative example, the first semiconductor devices 920 may include a vertically alternating stack of insulating layers 32 and electrically conductive layers 46, and a two-dimensional array of memory openings vertically extending through the vertically alternating stack (32, 46). The electrically conductive layers 46 may comprise word lines of the three-dimensional NAND memory device.

Figure 1C:
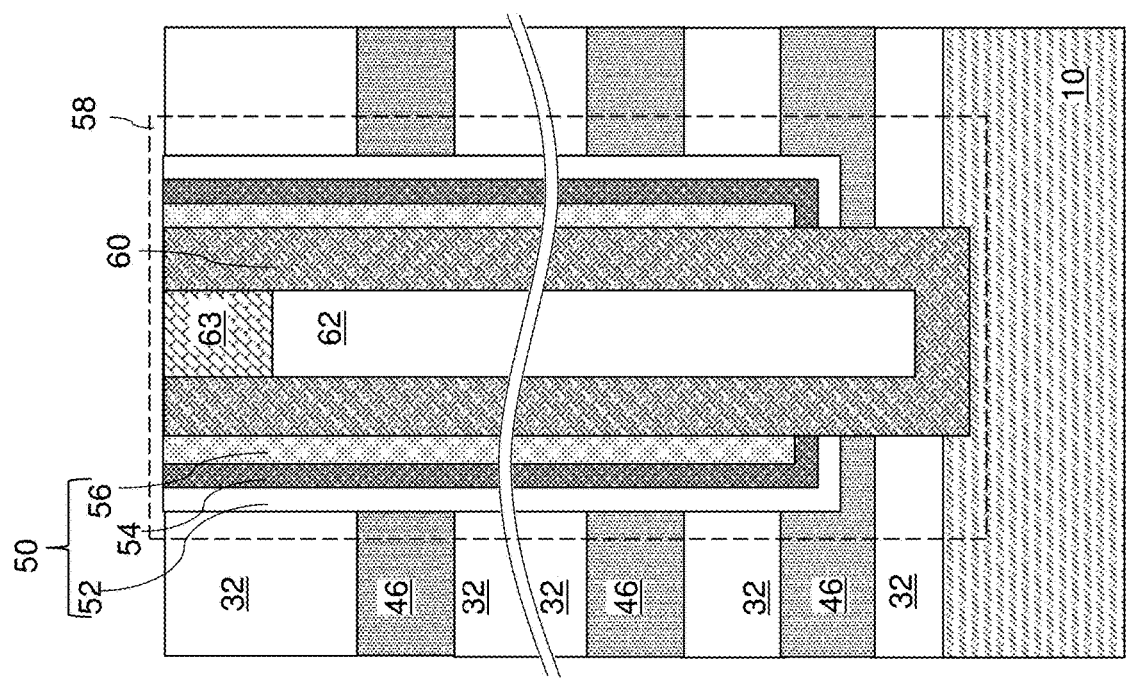
FIG. 1C is a schematic vertical cross-sectional close up view of a region containing one memory opening fill structure of the memory die of FIG. 1A.

A memory opening fill structure 58 may be formed within each memory opening in a memory array region 100. As shown in FIG. 1C, the memory opening fill structure 58 may include a memory film 50 and a vertical semiconductor channel 60 contacting the memory film. A drain region 63 is located on a top part of the vertical semiconductor channel 60. An optional dielectric fill region 62 may be located below the drain region 63 and surrounded by the vertical semiconductor channel 60. The memory film may include a blocking dielectric 52, a tunneling dielectric 46 and a charge storage material 54 located between the blocking and tunneling dielectrics. The charge storage material 54 may comprise a charge trapping layer, such as a silicon nitride layer, or a plurality of discrete charge trapping regions, such as floating gates or discrete portions of a charge trapping layer. The portions of the charge storage material 54 adjacent to the electrically conductive layers (i.e., word lines/control gate electrodes) 46 comprise memory elements (e.g., memory cells). In this case, each memory opening fill structure 58 and adjacent portions of the electrically conductive layers 46 constitute a vertical NAND string. Alternatively, the memory opening fill structures 58 may include any type of non-volatile memory elements such as resistive memory elements, ferroelectric memory elements, phase change memory elements, etc. The memory device may include an optional horizontal semiconductor channel layer 10 connected to the bottom end of each vertical semiconductor channel, and an optional dielectric spacer layer 910 that provides electrical isolation between the first substrate 908 and the horizontal semiconductor channel layer 10.

The electrically conductive layers 46 may be patterned to provide a staircase region (i.e., a terrace region) 200 in which each overlying electrically conductive layer 46 has a lesser lateral extent than any underlying electrically conductive layer 46. Contact via structures (not shown) may be formed on the electrically conductive layers 46 in the terrace region to provide electrical connection to the electrically conductive layers 46. Dielectric material portions 65 may be formed around each vertically alternating stack (32, 46) to provide electrical isolation among neighboring vertically alternating stacks (32, 46).

Through-memory-level via cavities can be formed through the dielectric material portions 65, the optional dielectric spacer layer 910, and the horizontal semiconductor channel layer 10. An optional through-memory-level dielectric liner 486 and a through-memory-level via structure 488 can be formed within each through-memory-level via cavity. Each through-memory-level dielectric liner 486 includes a dielectric material such as silicon oxide. Each through-memory-level via structure 488 includes any suitable electrically conductive material (e.g., tungsten, copper, titanium nitride, etc.) can be formed directly on a respective one of the through-substrate via structure 388.

The first dielectric material layers (290, 960, 970) may include first contact-level dielectric layers 290 embedding contact via structures and bit lines 982, first interconnect-level dielectric layers 960 that embed a subset of the first metal interconnect structures 980 located above the first contact-level dielectric layers 290, and a first bonding dielectric layer 970 that is formed above the first interconnect-level dielectric layers 960. The bit lines 982 are a subset of the first metal interconnect structures 980 and may electrically contact drain regions 63 located above the semiconductor channels 60 at the top of the memory opening fill structures 58. The contact via structures contact various nodes of the first semiconductor devices or the through-memory-level via structure 488. Interconnect metal lines and interconnect metal via structures, (which are subsets of the first metal interconnect structures 980) may be embedded in the first interconnect-level dielectric layers 960. Thus, the first metal interconnect structures 980 can be located within the first interconnect-level dielectric layers 960. In an illustrative example, the first metal interconnect structures 980 may include a first memory-side metal level M0 including memory-side first-level metal lines (including bit lines 982 and other first-level metal lines), and a second memory-side metal level M1 including memory-side second-level metal lines.

Each of the first contact-level dielectric layers 290 and the first interconnect-level dielectric layers 960 may include a dielectric material such as undoped silicate glass, a doped silicate glass, organosilicate glass, silicon nitride, a dielectric metal oxide, or a combination thereof. The first bonding dielectric layer 970 may include, and/or consist essentially of, a silicon oxide material such as undoped silicate glass (e.g., silicon oxide) or a doped silicate glass. The thickness of the first bonding dielectric layer 970 may be in a range from 100 nm to 3,000 nm, although lesser and greater thicknesses may also be employed. The first bonding dielectric layer 970 may have a planar top surface, which may be provided, for example, by a planarization process such as a chemical mechanical polishing (CMP) process. A topmost layer of the first interconnect-level dielectric layers 960 may be a dielectric diffusion barrier layer (not expressly shown), which may be a silicon nitride layer having a thickness in a range of 10 nm to 300 nm.

First bonding pads 988 are formed in the first bonding dielectric layer 970, for example, by forming pad cavities in the first bonding dielectric layer 970 and filling the pad cavities with at least one conductive material. Alternatively, the first bonding pads 988 are formed on the first metal interconnect structures 980 first, followed by forming the first bonding dielectric layer 970 over and around the first bonding pads 988, followed by planarizing the first bonding dielectric layer 970 to expose the top surface of the first bonding pads 988. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP.

Each of the first bonding pads 988 is surrounded by the first bonding dielectric layer 970 and contacts a respective underlying one of the first metal interconnect structures 980. Each of the first bonding pads 988 is electrically connected to a respective node of the first semiconductor devices 920. In case the first semiconductor die 900 comprises a memory die, the first bonding pads 988 are also referred to as memory-side bonding pads.

Generally, the first semiconductor die 900 can comprise a memory die. The memory die can comprise a three-dimensional array of memory elements located within a memory array region having an array region length 1 along a first horizontal direction hd1 (e.g., bit line direction) and having an array region width w along a second horizontal direction hd2 (e.g., word line direction) that is perpendicular to the first horizontal direction dh1. The memory elements (e.g., charge storage regions 54 in a memory film 50) can be arranged around a two-dimensional array of vertical semiconductor channels, and bit lines 982 can be connected to drain regions 63 at top end portions of a respective subset of the vertical semiconductor channels 60. The first semiconductor die 900 can comprise through-substrate via structures 388 electrically connected to a subset of first bonding pads 988 (i.e., memory-side bonding pads) located along a front-side edge of the first semiconductor die 900.

In one embodiment illustrated in FIG. 1B, the first bonding pads 988 can include first input-output bonding pads 988A located within a pair of memory-side input-output regions MIO. The first input-output bonding pads 988A are connected to input-output nodes of a respective one of the three-dimensional array of memory elements. In one embodiment, the memory-side input-output regions MIO can be located along a pair of front-side edges of the first semiconductor die 900. In one embodiment, a subset of the through-substrate via structures 388 and the through-memory-level via structures 488 can be located within the memory-side input-output regions MIO.

In one embodiment, the first bonding pads 988 can include first word-line hookup bonding pads 988B located over the stepped surfaces of a respective alternating stack of insulating layers 32 and electrically conductive layers 46 in the staircase region 200. The first word-line hookup bonding pads 988B are connected to a respective one of the electrically conductive lines 46 that function as word lines of a three-dimensional array of memory elements. Each cluster of first word-line hookup bonding pads 988B can be located within a respective memory-side word-line hookup region MWLHU. Each memory-side word-line hookup region MWLHU can be located adjacent to a respective memory-side input-output region MIO.

In one embodiment, the first bonding pads 988 can include first bit-line hookup bonding pads 988C located adjacent to a respective memory array region including a respective three-dimensional array of memory elements. The first bit-line hookup bonding pads 988C are connected to a respective one of the bit lines 982. Each cluster of first bit-line hookup bonding pads 988C can be located within a respective memory-side bit-line hookup region MBLHU. Each memory-side bit-line hookup region MBLHU can be located adjacent to a respective memory-side input-output region MIO and to a respective memory-side word-line hookup region MWLHU.

In one embodiment, the first bonding pads 988 can include first peripheral bonding pads 988D located within the area of a respective memory array region. The first peripheral bonding pads 988D are connected to various peripheral circuit elements located in the first semiconductor die 900. The various peripheral circuit elements may include, for example, source-side select electrodes and drain-side select electrodes. In one embodiment, source-side select electrodes may comprise a set of at least one bottommost electrically conductive layer within each alternating stack of insulating layers 32 and electrically conductive layers 46, and drain-side select electrodes may comprise a set of at least one topmost electrically conductive layer within each alternating stack of insulating layers 32 and electrically conductive layers 46. Each cluster of first peripheral bonding pads 988D can be located within a respective memory-side peripheral connection region MPERI. Each memory-side peripheral connection region MPERI can be located adjacent to a respective memory-side bit-line hookup region MBLHU and to a respective memory-side word-line hookup region MWLHU. In an illustrative example, each memory-side word-line hookup region MWLHU can be located adjacent to, and can be laterally offset along the second horizontal direction (e.g., word line direction) hd2 from a memory-side peripheral connection region MPERI. Further, each memory-side bit-line hookup region MBLHU can be located adjacent to, and can be laterally offset along the first horizontal direction hd1 (e.g., bit line direction) from a memory-side peripheral connection region MPERI.

Each memory-side power and control signal region MPCS can contain no first bonding pads 988 or it may contain miscellaneous first bonding pads 988E if additional bonding pads are required for the device. Each memory-side power and control signal region MPCS can be located adjacent to a respective memory-side peripheral connection region MPERI, a respective memory-side bit-line hookup region MBLHU, and a respective memory-side input-output region MIO. In an illustrative example, each memory-side power and control signal region MPCS can be laterally offset along the first horizontal direction hd1 from the respective memory-side peripheral connection region MPERI, and from the respective memory-side input-output region MIO, and can be laterally offset along the second horizontal direction hd2 from the respective memory-side bit-line hookup region MBLHU. In other words, each memory-side power and control signal region MPCS can located between the respective memory-side peripheral connection region MPERI and the respective memory-side input-output region MIO along the first horizontal direction hd1. Furthermore, each memory-side power and control signal region MPCS can located between two respective memory-side bit-line hookup regions MBLHU along the second horizontal direction hd2.

Figure 2A:
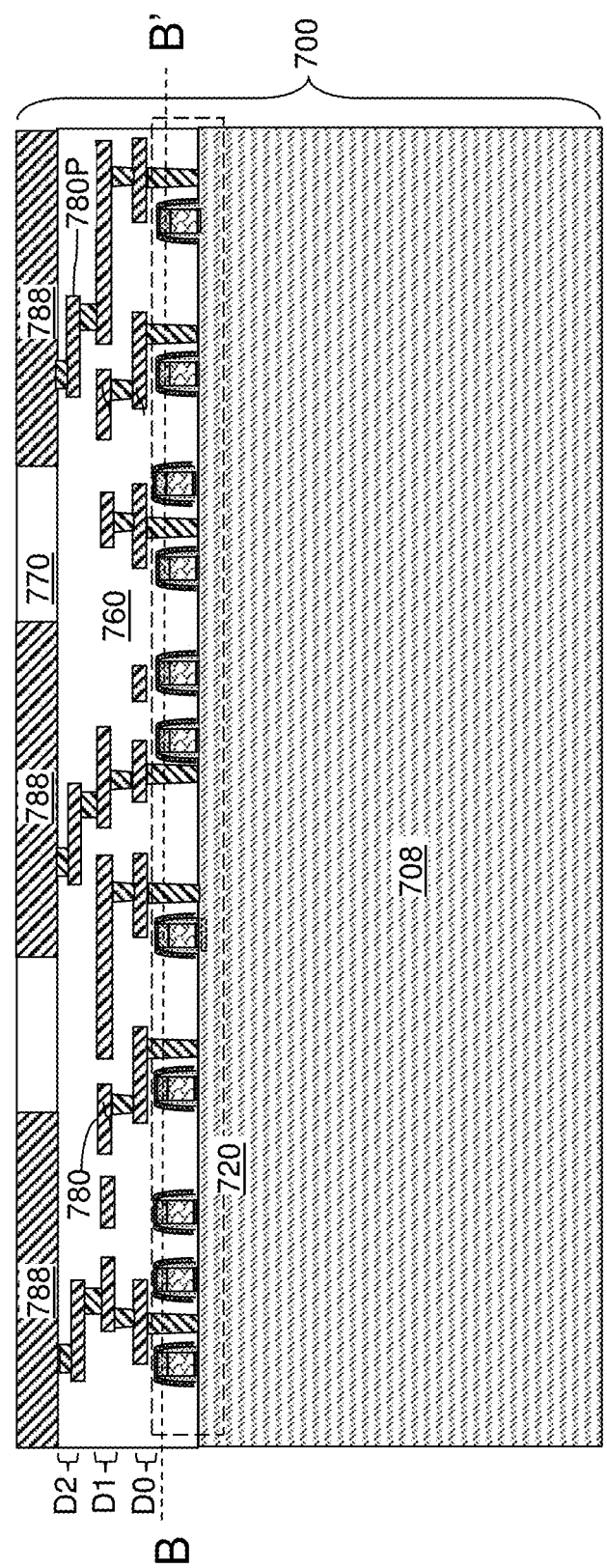
FIG. 2A is a schematic vertical cross-sectional view of a logic die in a first configuration after formation of a logic-side bonding dielectric layer and logic-side bonding pads according to an embodiment of the present disclosure.
Figure 2B:
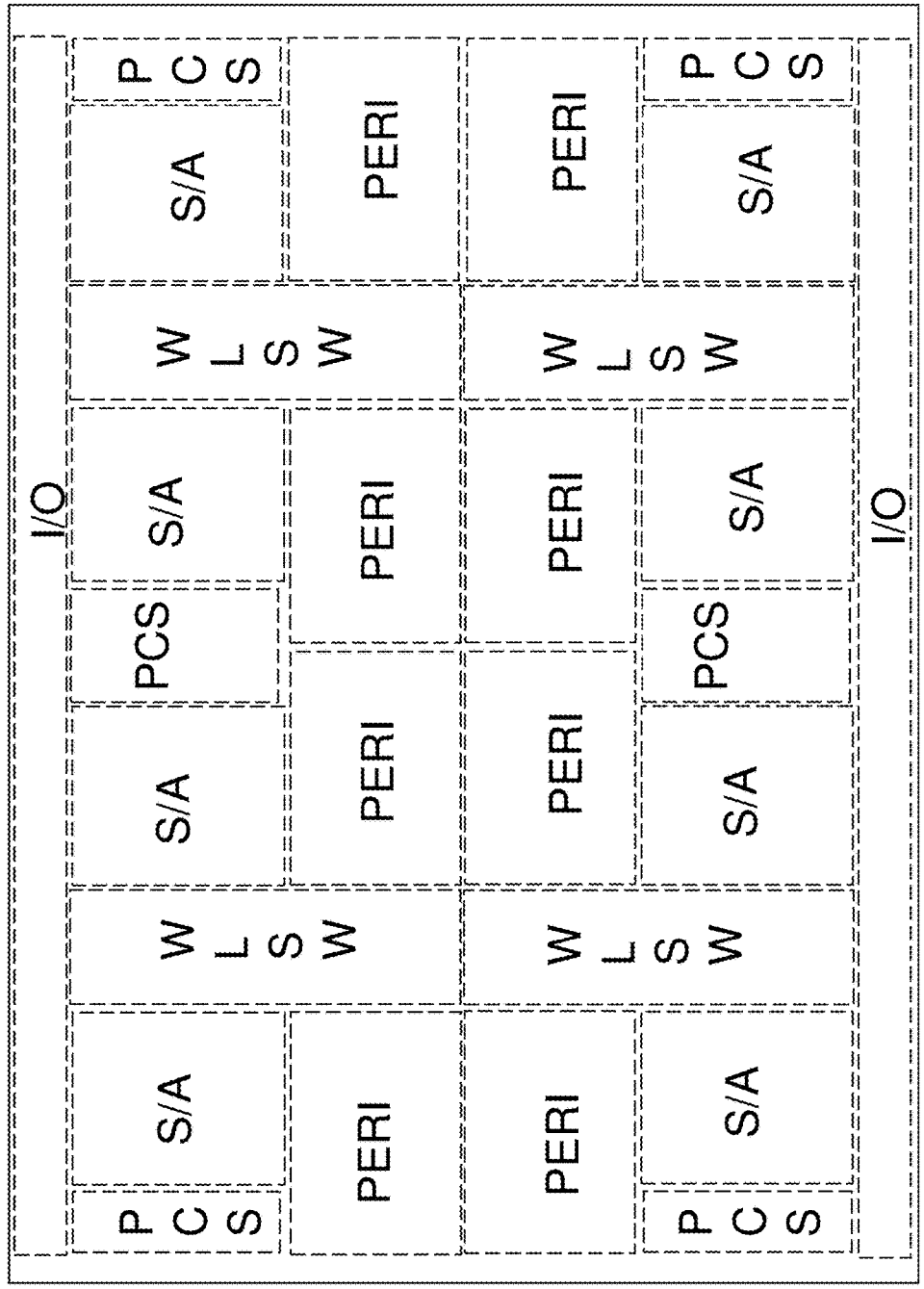
FIG. 2B is a schematic horizontal cross-sectional view of regions the logic die of FIG. 2A along plane B-B'.
Figure 2C:
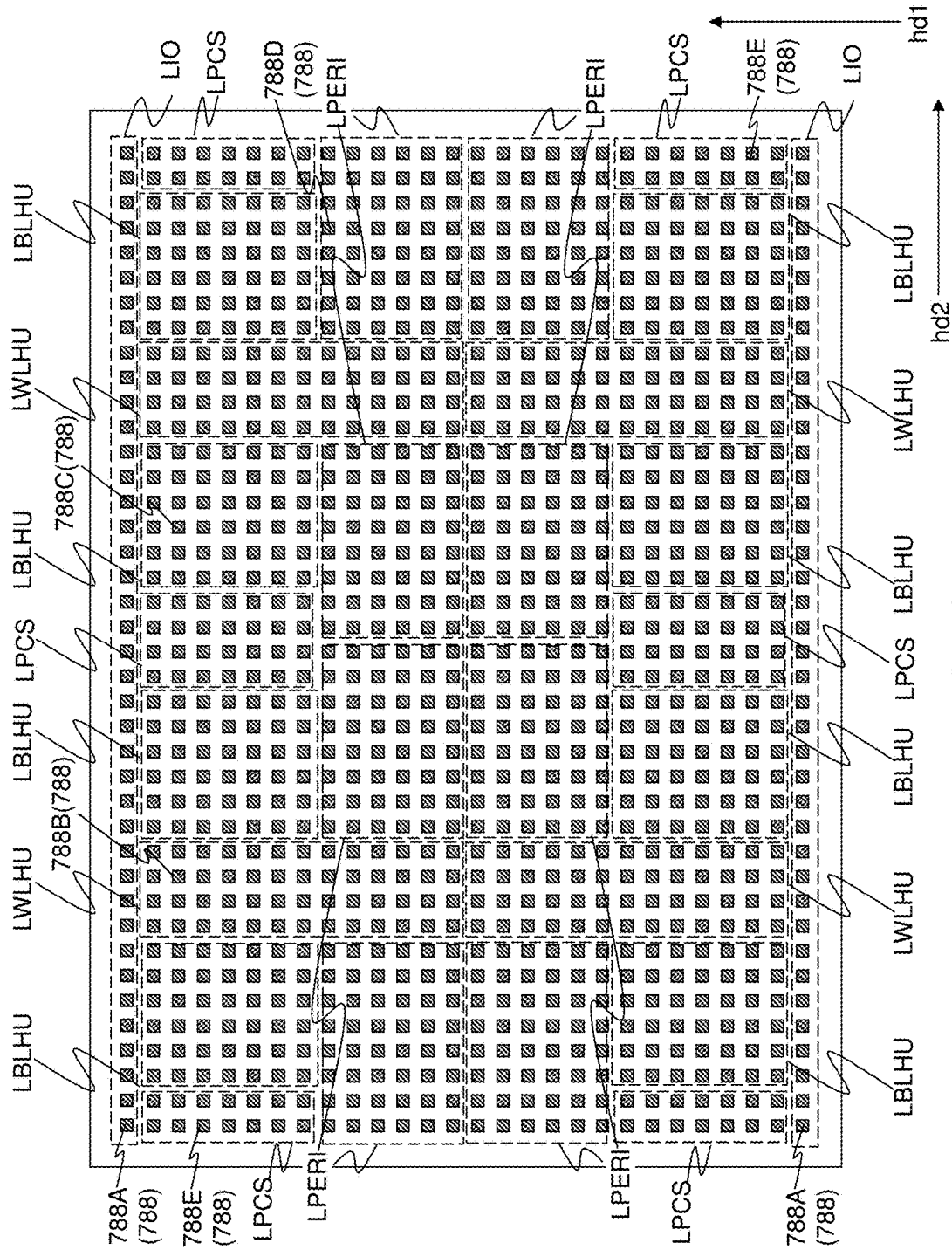
FIG. 2C is a top-down view of the logic die of FIG. 2A.

Referring to FIGS. 2A-2C, a second semiconductor die 700 is illustrated. The second semiconductor die 700 includes a second substrate 708, second semiconductor devices 720 overlying the second substrate 708, second dielectric material layers (760, 770) overlying the second semiconductor devices 720, and second metal interconnect structures 780 embedded in the second dielectric material layers (760, 770). At least one of the second metal interconnect structures 780 may comprise power and control signal interconnect structures 780P located in the power and control signal region PCS.

In one embodiment, the second semiconductor devices 720 may include field effect transistors in a complementary metal oxide semiconductor (CMOS) configuration. In one embodiment, the second substrate 708 may be a commercially available silicon substrate having a thickness in a range from 500 microns to 1 mm.

Generally, the second semiconductor devices may comprise any semiconductor devices that may be operated in conjunction with the first semiconductor devices in the first semiconductor die 900 to provide enhanced functionality. In one embodiment, the first semiconductor die 900 comprises a memory die and the second semiconductor die 700 comprises a logic die that includes a support circuitry (i.e., control circuitry, e.g., peripheral circuitry) for operation of memory devices (such as a three-dimensional array of memory elements) within the memory die. In one embodiment, the first semiconductor die 900 may include a three-dimensional memory device including a three-dimensional array of memory elements, word lines (that may comprise a subset of the electrically conductive lines 46), and bit lines 982, the second semiconductor devices 720 of the second semiconductor die 700 may include a peripheral circuitry for operation of the three-dimensional array of memory elements. The peripheral circuitry may include one or more word line driver circuits that drive the word lines of the three-dimensional array of memory elements of the first semiconductor die 900, one or more bit line driver circuits that drive the bit lines 982 of the first semiconductor die 900, one or more word line decoder circuits that decode the addresses for the word lines, one or more bit line decoder circuits that decode the addresses for the bit lines 982, one or more sense amplifier circuits that sense the states of memory elements within the memory opening fill structures 58 of the first semiconductor die 900, a source power supply circuit that provides power to the horizontal semiconductor channel layer 10 in the first semiconductor die 900, a data buffer and/or latch, and/or any other semiconductor circuit that may be used to operate three-dimensional memory device of the first semiconductor die 900.

The second dielectric material layers (760, 770) can include second interconnect-level dielectric layers 760 embedding the second metal interconnect structures 780, and a second bonding dielectric layer 770 that is formed above the second interconnect-level dielectric layers 760. The second interconnect-level dielectric layers 760 may include a dielectric material such as undoped silicate glass (e.g., silicon oxide), a doped silicate glass, organosilicate glass, silicon nitride, a dielectric metal oxide, or a combination thereof. In an illustrative example, the second metal interconnect structures 780 may include a first logic-side metal level D0 including logic-side first-level metal lines, a second logic-side metal level D1 including logic-side second-level metal lines, and third logic-side metal level D2 including logic-side third-level metal lines. Level D0 may be used for local routing/interconnects, level D1 may be used for bus routing/interconnects, and level D2 may be used for global routing/interconnects. As will be described below, a fourth logic-side metal level may be omitted and global delivery may be provided through vertical interconnects located in the power and control signal region PCS adjacent to the sense amplifier regions.

The second bonding dielectric layer 770 may include undoped silicate glass or a doped silicate glass (e.g., a doped or undoped silicon oxide material). The thickness of the second bonding dielectric layer 770 may be in a range from 100 nm to 3,000 nm, although lesser and greater thicknesses may also be employed. The second bonding dielectric layer 770 may have a planar top surface, which may be provided, for example, by a planarization process such as a chemical mechanical polishing (CMP) process.

Second bonding pads 788 are formed in the second bonding dielectric layer 770, for example, by forming pad cavities in the second bonding dielectric layer 770 and filling the pad cavities with at least one conductive material. Alternatively, the bonding pads 788 are formed on the second metal interconnect structures 780 first, followed by forming the second bonding dielectric layer 770 over and around the second bonding pads 788, followed by planarizing the second bonding dielectric layer 770 to expose the top surface of the second bonding pads 788. The at least one conductive material may be a metallic (i.e., metal or metal alloy) material that may be bonded to the same metallic material or to another metallic material by metal-to-metal or hybrid bonding. For example, each of the first bonding pads 988 may include an optional metallic liner that includes TiN, TaN, and/or WN, and a metal fill material portion that includes the metallic material that may be bonded to the same metallic material or to another metallic material by metal-to-metal bonding. For example, the metal fill material portion may include, and/or consist essentially of, any material selected from Cu, a copper alloy including copper at an atomic concentration greater than 70% (which may be greater than 90% and/or 95%), or a cobalt or nickel alloy, such as CoW, CoWP, CoMoP, NiW, and/or NiWP. The material of the second bonding pads 788 may be the same as, or may be different from, the material of the first bonding pads 988.

Each of the second bonding pads 788 is embedded in the second bonding dielectric layer 770 and contacts a respective underlying one of the second metal interconnect structures 780. Each of the second bonding pads 788 is electrically connected to a respective node of the second semiconductor devices 720. In case the second semiconductor die 700 comprises a logic die, the second bonding pads 788 are also referred to logic-side bonding pads.

The types of devices of the first semiconductor die 900 and of the second semiconductor die 700 may be selected in any manner such that the devices 920 of the first semiconductor die 900, and the second semiconductor devices 720 of the second semiconductor die 700 may communicate with each other, and control, and or are controlled by, devices in the other semiconductor die. In one embodiment, one of the first semiconductor die 900 and the second semiconductor die 700 comprises a memory die including memory elements, such as a three-dimensional array of memory elements, and another of the first semiconductor die 900 and the second semiconductor die 700 comprises a logic die including peripheral circuitry configured to operate the memory elements, such as the three-dimensional array of memory elements.

Generally, the second semiconductor die 700 can comprise a logic die. The logic die can comprise a control circuit 702 configured to control operation of the three-dimensional array of memory elements of the second semiconductor die 900. FIG. 2B illustrates an example of the logic die 700 configured to control a memory die 900 containing four memory planes. However, the logic die 700 may be configured to control a memory die 900 containing less than four (e.g., one or more) or more than four (e.g., six to eight) memory planes. As shown in FIG. 2B, the control circuit 702 comprises a peripheral circuit region (PERI) located within an area that overlaps in plan view with an area of the memory array region 100 of the first semiconductor die 900 after the first semiconductor die 900 is bonded to the second semiconductor die 700, a sense amplifier region (S/A) laterally offset from the peripheral circuit region PERI along the first horizontal direction (e.g., bit line direction) hd1, a word line switch region (WLSW) located between respective peripheral regions PERI and between respective sense amplifier regions S/A along the second horizontal direction (e.g., word line direction) hd2, an input/output circuit region (I/O) located along at least one edge of the logic die, and a power and control signal region (PCS) having a boundary that borders the peripheral circuit region PERI, the sense amplifier region S/A, and the input/output circuit region I/O. The peripheral circuit region PERI can include one or more of bit line driver circuits (BLDRV shown in FIGS. 7B and 8B), bit line decoder/column direction logic control circuit, a latch circuit that functions as a cache memory of the NAND memory device 920, word line driver circuits, memory well bias circuit, shunt circuits, and other miscellaneous circuits. The word line switch WLSW region can include word line control transistors, word line decoders and optionally word line driver circuits.

In one embodiment, the sense amplifier region S/A can be laterally offset from the peripheral circuit region PERI along the first horizontal direction hd1, and can have a sense amplifier region width along the second horizontal direction hd2 that is less than the memory array region 100 width in the first semiconductor die 900 and less than the peripheral circuit region PERI width along the second horizontal direction hd2. The power and control signal region PCS can be laterally offset from the sense amplifier region S/A along the second horizontal direction hd2 and can be laterally offset from the peripheral region PERI along the first horizontal direction hd1. In one embodiment, the width of the peripheral circuit region PERI along the second horizontal direction hd2 can be the same as the sum of the sense amplifier region S/A width and the width of the power and control signal region PCS along the second horizontal direction hd2.

In one embodiment, the control circuit 702 can comprise the input/output circuit region I/O located along an edge of the logic die, and the power and control signal region PCS can have a boundary that borders the peripheral circuit region PERI, the sense amplifier region S/A, and the input/output circuit region I/O. In one embodiment, the logic die comprises metal interconnect structures, i.e., the second metal interconnect structures 780, that electrically connect nodes of the input/output circuit region (e.g., nodes of power and control signal vias) to a subset 788A of second bonding pads 788 located along a front-side edge of the logic die.

As shown in FIG. 2C, the second bonding pads 788 can be arranged in the pattern of the mirror image of the first bonding pads 988. For example, if the first bonding pads 988 are arranged as a first I×J rectangular periodic array, then the second bonding pads 788 can be arranged as a second I×J rectangular periodic array having the same periodicity as the first I×J rectangular periodic array. I can J can be independent integers greater than 8. For example, I of second bonding pads 788 can be located within each column of second bonding pads 788 that extends along the first horizontal direction hd1, and J of second bonding pads 788 can be located within each row of second bonding pads 788 that extends along the second horizontal direction hd2. In one embodiment, the second bonding pads 788 can have the same size as the first bonding pads 988. In another embodiment, the size of the second bonding pads 788 may be modified relative to the size of the first bonding pads 988. In this case, the second bonding pads 788 may be larger than, or smaller than, the first bonding pads 988.

In one embodiment, the second bonding pads 788 can include second input-output bonding pads 788A located within a pair of logic-side input-output regions LIO. The second input-output bonding pads 788A are connected to nodes of the input/output circuit region I/O located along at least one edge of the second semiconductor die 700. In one embodiment, the logic-side input-output regions LIO can be located along one or along a pair of front-side edges of the second semiconductor die 700. The area of the logic-side input-output regions LIO of the second semiconductor die 700 can be a mirror image of the area of the memory-side input-output regions MIO of the first semiconductor die 900. The input/output circuit region I/O is located under region LIO.

In one embodiment, the second bonding pads 788 can include second word-line hookup bonding pads 788B located over the stepped surfaces of a respective alternating stack of insulating layers 32 and electrically conductive layers 46 in a staircase (i.e., terrace) region 200 of the memory die 900 after the memory die 900 is bonded to the logic die 700. The second word-line hookup bonding pads 788B are connected to a respective node of a word line decoder located in the word line switch region WLSW. Each cluster of second word-line hookup bonding pads 788B can be located within a respective logic-side word-line hookup region LWLHU. The word line decoder provides a control signal through each logic-side word-line hookup region LWLHU to activate a selected subset of word lines 46 in a respective three-dimensional memory device 920 in the first semiconductor die 900. The word line decoder in the word line switch region WLSW is located below region LWLHU. Each logic-side word-line hookup region LWLHU can be located adjacent to a respective logic-side input-output region LIO along the first horizontal direction (e.g., bit line direction) hd1. The area of the logic-side word-line hookup regions LWLHU of the second semiconductor die 700 can be a mirror image of the area of the memory-side word-line hookup regions MWLHU of the first semiconductor die 900.

In one embodiment, the second bonding pads 788 can include second bit-line hookup bonding pads 788C connected to sense amplifiers within the second semiconductor die 700. The areas of the second bit-line hookup bonding pads 788C are herein referred to logic-side bit-line hookup regions LBLHU. The areas of the sense amplifiers are herein referred to as sense amplifier regions S/A. In one embodiment, the sense amplifier regions S/A can be located below the logic-side bit-line hookup regions LBLHU. In another embodiment, the sense amplifier regions can have an areal overlap with at least 50%, and/or with at least 80%, and/or with at least 90%, of the areas of the logic-side bit-line hookup regions LBLHU. Each cluster of second bit-line hookup bonding pads 788C can be located within a respective logic-side bit-line hookup region LBLHU. Each logic-side bit-line hookup region LBLHU can be located adjacent to a respective logic-side input-output region LIO along the first horizontal direction hd1 and to a respective logic-side word-line hookup region LWLHU along the second horizontal direction. Thus, each region LWLHU located above the word line switch region WLSW can be located between two regions LBLHU (which are located above the respective sense amplifier regions S/A) along the second horizontal direction hd2. The area of the logic-side bit-line hookup regions LBLHU of the second semiconductor die 700 can be a mirror image of the area of the memory-side bit-line hookup regions MBLHU of the first semiconductor die 900.

In one embodiment, the second bonding pads 788 can include second peripheral bonding pads 788D located within the area of a respective logic-side peripheral connection region LPERI, which is located above the peripheral circuit region PERI. The second peripheral bonding pads 788D are connected to various peripheral circuit elements located in a respective peripheral circuit region in the second semiconductor die 700. Each peripheral circuit region can be located within an area that overlaps with the mirror image of an area of a respective memory array region in the first semiconductor die 900. In one embodiment, each sense amplifier region located below region LBLHU can be laterally offset from a respective peripheral circuit region located below region LPERI along the first horizontal direction hd1.

The various peripheral circuit elements in region PERI may include, for example, control transistors in a CMOS configuration generating control signals for the bit lines and/or word lines in the three-dimensional memory array in the first semiconductor die 900. Each cluster of second peripheral bonding pads 788D can be located within a respective logic-side peripheral connection region LPERI. Each logic-side peripheral connection region LBLHU can be located adjacent to a respective logic-side input-output region LIO along the first horizontal direction and to a respective logic-side word-line hookup region LWLHU along the second horizontal direction. In an illustrative example, each logic-side word-line hookup region LWLHU can be located adjacent to, and can be laterally offset along the second horizontal direction hd2 from, a logic-side peripheral connection region LPERI. Further, each logic-side bit-line hookup region LBLHU can be located adjacent to, and can be laterally offset along the first horizontal direction hd1 from, a logic-side peripheral connection region LPERI. The area of the logic-side peripheral connection regions LBLHU of the second semiconductor die 700 can be a mirror image of the area of the memory-side peripheral connection regions MBLHU of the first semiconductor die 900.

According to an aspect of the present disclosure, region LPCS may lack any second bonding pads 788. Alternatively, the second bonding pads 788 can include second miscellaneous bonding pads 788E in region LPCS if additional bonding pads are required. The power supply and control interconnect structures 780P are a subset of the second metal interconnect structures 780 that are configured to transmit power supply voltages and control signals. The area of sets of power supply and control interconnect structures is herein referred to as a power supply and control signal region PCS. If present, the second miscellaneous bonding pads 788E can be located within a respective logic-side power and control signal region LPCS, which overlies the power supply and control signal region PCS. Each logic-side power and control signal region LPCS can be located adjacent to to a respective logic-side peripheral connection region LPERI along the first horizontal direction hd1, a respective logic-side bit-line hookup region LBLHU along the second horizontal direction hd2, and a respective logic-side input-output region LIO along the first horizontal direction hd1. In an illustrative example, each logic-side power and control signal region LPCS can be located between and be laterally offset along the first horizontal direction hd1 from the respective logic-side peripheral connection region LPERI, and from the respective logic-side input-output region LIO, and can be located between and be laterally offset along the second horizontal direction hd2 from two respective logic-side bit-line hookup regions LBLHU.

The area of the logic-side power and control signal regions LPCS of the second semiconductor die 700 can be a mirror image of the area of the memory-side power and control signal regions LPCS of the first semiconductor die 900. In one embodiment, each power and control signal region PCS can have a boundary that borders a respective peripheral circuit region PERI, a respective sense amplifier region S/A, and the input/output circuit region I/O, as shown in FIG. 2B.

Figure 3:
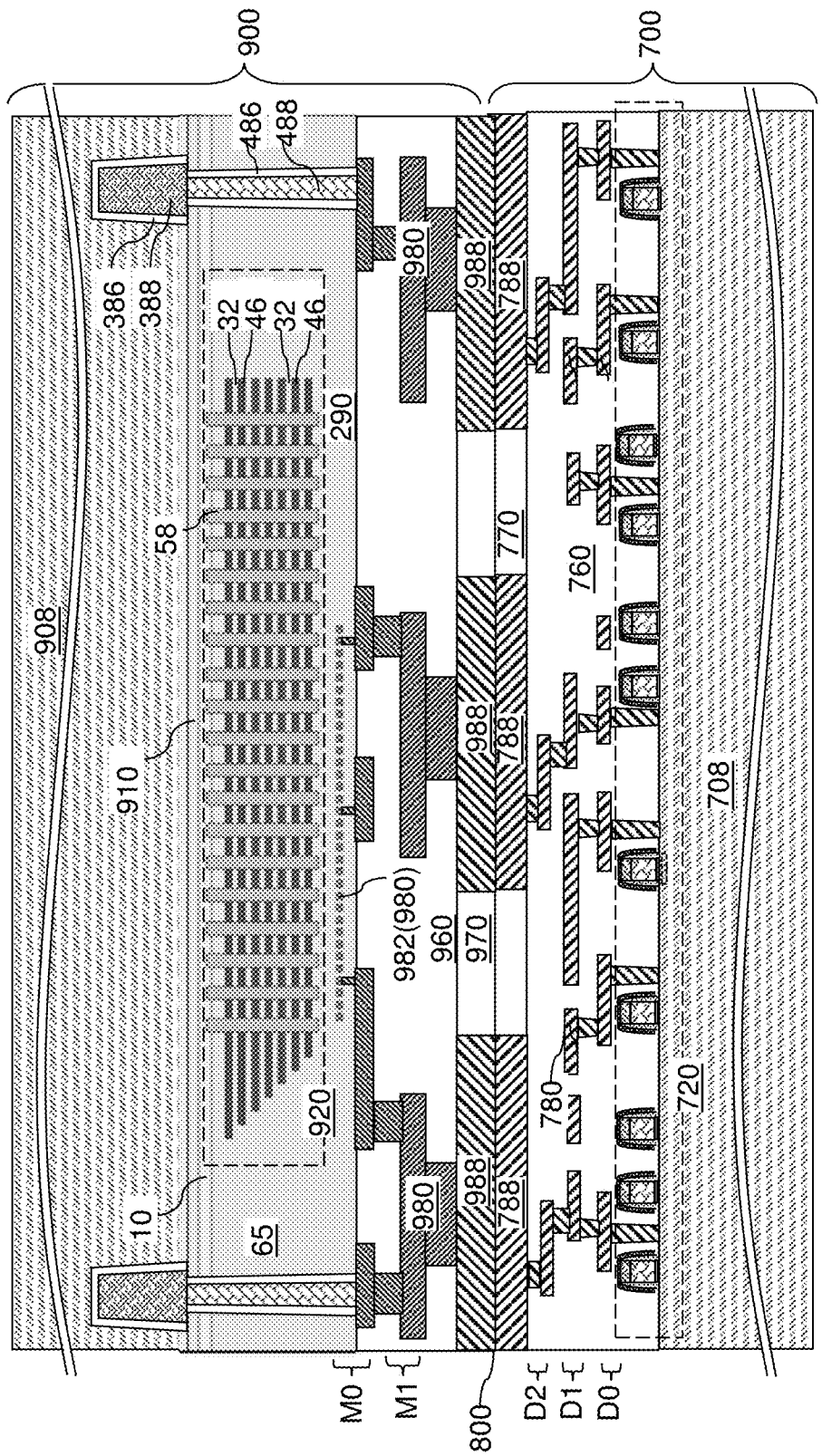
FIG. 3 is a vertical cross-sectional view of a bonded assembly of the memory die of FIGS. 1A and 1B and the logic die of FIGS. 2A and 2B according to an embodiment of the present disclosure.

Referring to FIG. 3, the first semiconductor die 900 and the second semiconductor die 700 are oriented such that the first bonding dielectric layer 970 faces the second bonding dielectric layer 770. The second semiconductor die 700 and the first semiconductor die 900 are brought into contact such that a surface of the second bonding dielectric layer 770 contacts a surface of the first bonding dielectric layer 970, and each surface of the second bonding pads 788 contacts a surface of a respective one of the first bonding pads 988. In one embodiment, the pattern of the second bonding pads 788 may be a mirror image of the pattern of the first bonding pads 988 with optional differences in the size of bonding pads between the first semiconductor die 900 and the second semiconductor die 700. In one embodiment, the first bonding pads 988 and the corresponding second bonding pads 788 may have the same size (i.e., lateral width). In another embodiment, the first bonding pads 988 and the corresponding second bonding pads 788 may have different sizes. In one embodiment, areal overlap between each facing pair of a first bonding pad 988 and a second bonding pad 788 may be at least 80%, and/or at least 90%, such as 90 to 100%, of the area of the smaller one of the first bonding pad 988 and the second bonding pad 788.

The second bonding pads 788 may be bonded to the first bonding pads 988 by performing an anneal process that induces metal-to-metal bonding between the second bonding pads 788 and the first bonding pads 988 and optionally dielectric bonding between the first bonding dielectric layer 970 and the second bonding dielectric layer 770. The anneal temperature may be selected based on the composition of the second bonding pads 788 and the first bonding pads 988. For example, if the second bonding pads 788 and the first bonding pads 988 include metal fill portions that consist essentially of copper, the anneal temperature may be in a range from 250 degrees Celsius to 400 degrees Celsius.

Each of the second input-output bonding pads 788A located within a pair of logic-side input-output regions LIO can be bonded to a respective one of the first input-output bonding pads 988A located within the pair of memory-side input-output regions MIO. Thus, input-output nodes in the first semiconductor die 900 are electrically connected to nodes of the input/output circuit control circuit 702 in the second semiconductor die 700 through bonded pairs of a second input-output bonding pad 788A and a first input-output bonding pad 988A. This subset of bonding pads (788A, 988B) is configured to transmit power and/or control signals through power and control signal interconnect structures 780P located in the power and control signal region PCS of the second semiconductor die 700. The power or control signals are transmitted between the first semiconductor die 900 (which can be a memory die) and the peripheral circuit region PERI of the second semiconductor die 700, and/or between the peripheral circuit region PERI and the sense amplifier region S/A of the second semiconductor die 700.

The areas of the logic-side input-output regions LIO can be the same as the areas of the memory-side input-output regions MIO in a plan view, which is a view along the direction perpendicular to the bonding interface 800 between the first semiconductor die 900 and the second semiconductor die 700.

The through-substrate via structures 388 in the first semiconductor die 900 can be electrically connected to a subset of first bonding pads 988 (e.g., memory-side input-output bonding pads 988A) located along a front-side edge of the first semiconductor die 900. The second semiconductor die 700 (which can be a logic die) can comprise second metal interconnect structures 788 that electrically connect nodes of the input/output circuit region I/O to the second input-output bonding pads 788A (which can be a subset of logic-side bonding pads located along a front-side edge of the second semiconductor die 700).

Each of second word-line hookup bonding pads 788B located within a respective logic-side word-line hookup region LWLHU can be bonded to a respective one of the first word-line hookup bonding pads 988B located within a respective memory-side word-line hookup region MWLHU. Thus, electrically conductive lines 46 that function as word lines of a three-dimensional array of memory elements are connected to a respective node of a word line decoder located in the word line switch region WLSW through a respective bonded pair of a second word-line hookup bonding pad 788B and a first word-line hookup bonding pad 988B. The areas of the logic-side word-line hookup regions LWLHU of the second semiconductor die 700 can be the same as the areas of the memory-side word-line hookup regions MWLHU of the first semiconductor die 900 in the plan view.

Each of the second bit-line hookup bonding pads 788C located within the logic-side bit-line hookup regions LBLHU can be bonded to a respective one of the first bit-line hookup bonding pads 988C located within a respective one of the memory-side bit-line hookup regions MBLHU. Thus, each bit line 982 in the first semiconductor die 900 can be electrically connected to a respective sense amplifier in one of the sense amplifier regions S/A in the second semiconductor die 700 through a bonded pair of a second bit-line hookup bonding pad 788C and a first bit-line hookup bonding pad 988C. The areas of the logic-side bit-line hookup regions LBLHU of the second semiconductor die 700 can be the same as the areas of the memory-side bit-line hookup regions MBLHU of the first semiconductor die 900 in the plan view.

Each of the second peripheral bonding pads 788D located within the logic-side peripheral connection regions LPERI can be bonded to a respective one of the first peripheral bonding pads 988D located within a respective one of the memory-side peripheral connection regions MPERI. Thus, peripheral circuit elements such as source-side select electrodes and drain-side select electrodes located in the first semiconductor die 900 are electrically connected to peripheral circuit elements such as select electrode drivers located in the second semiconductor die 700 through pairs of a second peripheral bonding pad 788D and a first peripheral bonding pad 988D. The areas of the logic-side peripheral connection regions LPERI of the second semiconductor die 700 can be the same as the areas of the memory-side peripheral connection regions MPERI of the first semiconductor die 900 in the plan view.

As will be described below with respect to FIGS. 7B and 8B, a vertical and lateral interconnections between the respective sense amplifier driver circuit (SADRV) elements located in the peripheral circuit region PERI and the respective sense amplifier circuit elements in the sense amplifier region S/A and between the peripheral circuit region PERI the respective elements in the input/output circuit region I/O, extend through the power and control signal region PCS located below the logic-side power and control signal regions LPCS. The areas of the logic-side power and control signal regions LPCS of the second semiconductor die 700 can be the same as the areas of the memory-side power and control signal regions MPCS of the first semiconductor die 900 in the plan view.

Figure 4A:
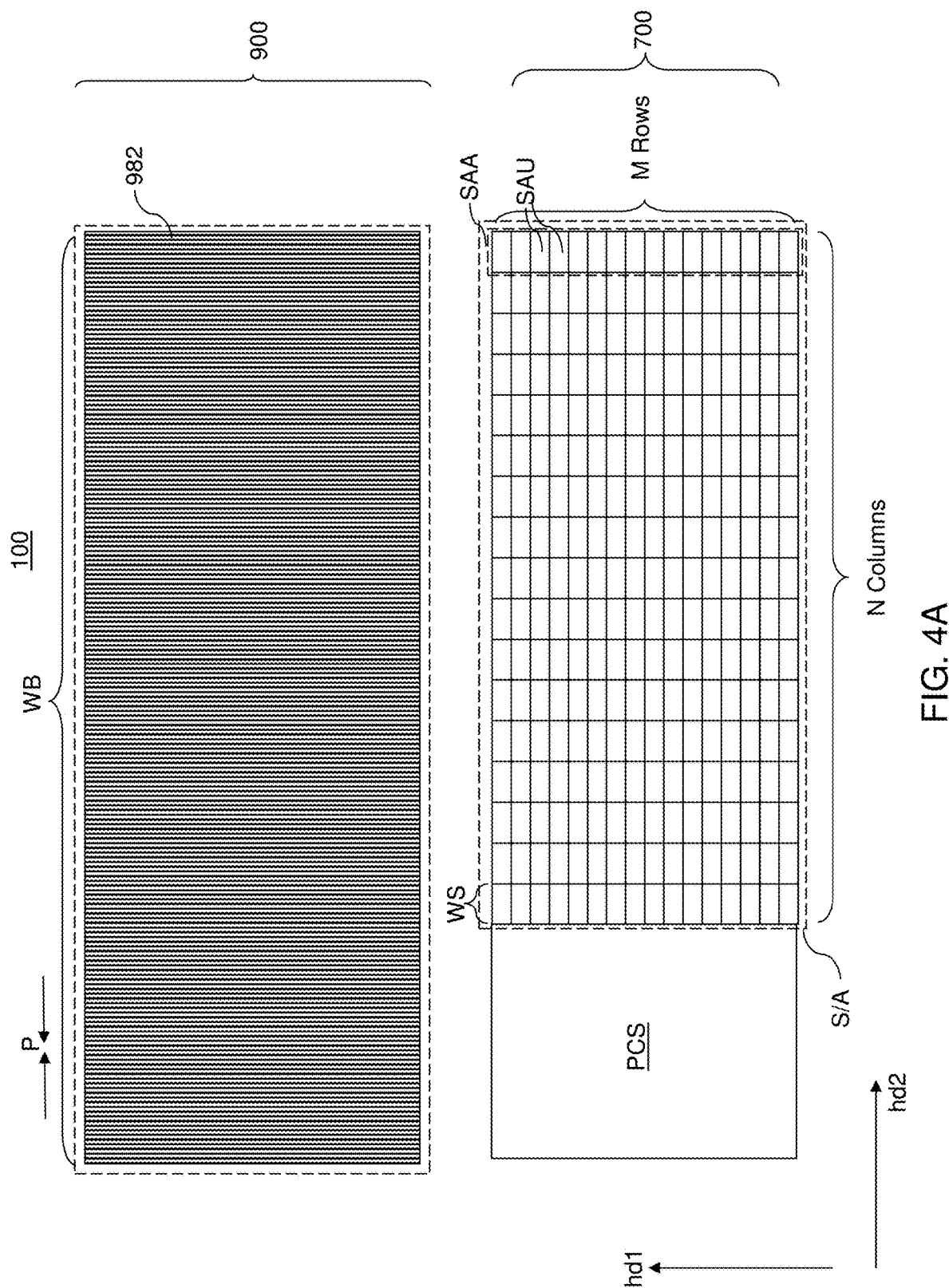
FIGS. 4A and 4B illustrate plan views of alternative embodiments of a memory array region of the memory die and a plan view of the power and control signal region and the sense amplifier region of the logic die located in the bonded assembly of FIG. 3.

FIG. 4A illustrates a plan view of a memory array region 100 of the memory die 900 and a plan view of the sense amplifier region S/A and the power and control signal region PCS of the logic die 700 within the bonded assembly of FIG. 3. The memory array region 100 of the first semiconductor die 900 can include a three-dimensional array of memory elements 920 and overlying bit lines 982. The area of the memory array region 100 may be the same as, or may substantially overlap with, the area of a memory-side peripheral region MPERI. For example, at least 50%, such as at least 80%, of the entire area of the memory-side peripheral region MPERI may overlap with the area of the memory array region. In one embodiment, the area of the memory array region 100 may be the same as the area of a memory-side peripheral region MPERI. There may be L bit lines overlying the memory array region 100. The bit lines 982 in the first semiconductor die 900 can laterally extend along the first horizontal direction (e.g., bit line direction) hd1 and may be separated from each other along the second horizontal direction (e.g., word line direction) hd2 within a bonded assembly of the first semiconductor die 900 and the second semiconductor die 700.

The area of the sense amplifier region S/A may be the same as, or may substantially overlap with, the area of the logic-side bit-line hookup region LBLHU. For example, at least 50%, such as at least 90%, of the entire area of the logic-side bit-line hookup region LBLHU may overlap with the area of the sense amplifier region. In one embodiment, the area of the sense amplifier region S/A may be the same as the area of the logic-side bit-line hookup region LBLHU. In one embodiment, the sense amplifier region S/A includes N sense amplifier assemblies SAA arranged along the second horizontal direction hd2. Each of the sense amplifier assemblies SAA can comprise M sense amplifier units SAU arranged along the first horizontal direction hd1. The total number of the sense amplifier units can be M×N, which is the same as the total number of the bit lines L. Each sense amplifier unit SAU can contain at least one field effect transistor and can be used to activated a respective one of the bit lines 982.

Figure 4B:
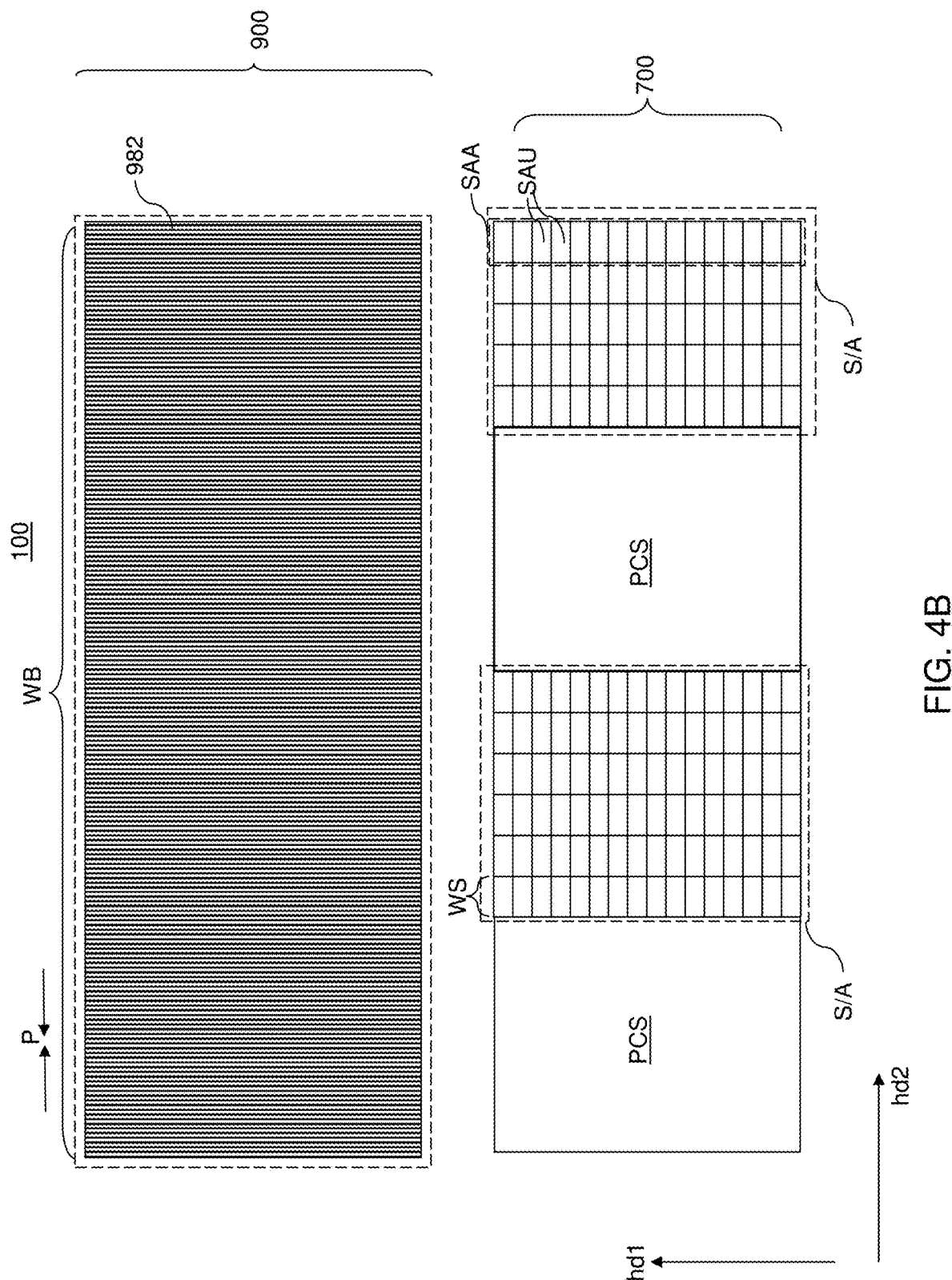

FIG. 4B illustrates a plan view of memory array region 100 of the memory die 900 and a plan view of the an alternative embodiment of sense amplifier region S/A and the power and control signal region PCS of the logic die 700 within the bonded assembly of FIG. 3. In this alternative embodiment, plural sense amplifier regions S/A and power and control signal regions PCS alternate along the second horizontal direction. Thus, a power and control signal region PCS may be located between two sense amplifier regions S/A, and a sense amplifier region S/A may be located between two power and control signal regions PCS.

According to an aspect of the present disclosure, a total of L bit lines 982 can laterally extend along the first horizontal direction hd1 and can have a bit line pitch P along the second horizontal direction hd2. In this case, the width, WB, of the area occupied by the bit lines 982 can be at least L×P along the second horizontal direction hd2 (e.g., WB=L×P). The width WB of the area along the second horizontal direction hd2 that is occupied by the bit lines 982 can be greater if intervening structures are present among the L bit lines 982.

The sense amplifier assemblies SAA can be arranged as a one-dimensional array along the second horizontal direction hd2, and the pitch of the sense amplifier assemblies SAA along the second horizontal direction hd2 can be less than M times the pitch P of the bit lines 982 along the second horizontal direction hd2. For example, the pitch P of the sense amplifier assemblies SAA along the second horizontal direction hd2 can be in a range from 40% to 90%, such as from 60% to 80%, of the product of the number M and the pitch of the bit lines 982 along the second horizontal direction hd2. As a consequence, the width of the sense amplifier region along the second horizontal direction hd2 can be a range from 40% to 90%, such as from 60% to 80%, of the product of the number M and the pitch P of the bit lines 982 along the second horizontal direction hd2. The width WB of the memory array region 100 in the first semiconductor die 900 along the second horizontal direction hd2 may be the same as product of the number L and the pitch P of the bit lines 982 along the second horizontal direction hd2. The sum of the widths of the power and control signal region PCS and the sense amplifier region S/A along the second horizontal direction hd2 can be the same as the width WB of the memory array region 100 along the second horizontal direction hd2. The width of the sense amplifier region S/A along the second horizontal direction hd2 can be smaller than the width WB.

In one embodiment, each sense amplifier assembly SAA may contain 16 sense amplifier units SAU (i.e., M=16). Each of the respective 16 sense amplifier units SAU in a SAA may be electrically connected to 16 respective bit line 982, such that each sense amplifier unit SAU is electrically connected to and controls one respective bit lines 982. However, the width (WS) of each sense amplifier assembly SAA along the second horizontal direction hd2 may be smaller (i.e., less) than the width of the pitch of the 16 respective bit lines 982 along the second horizontal direction hd2 (i.e., WS<16×P, or more generally WS<M×P). This makes the effective sense amplifier unit SAU pitch smaller than the bit line pitch P. For example, if the width (WS) of each sense amplifier assembly SAA along the second horizontal direction equals to the width of the pitch of 12 respective bit lines 982 (i.e., M-X bit lines, where X is a positive integer), then the pitch ratio of the effective sense amplifier unit SAU pitch to bit line pitch P equals to 0.75. This leaves additional space in the second horizontal direction for the power and signal connection region PCS. It should be noted that each SAA may contain more than or less than 16 SAU, and that the width WS may be greater than or less than the width of 12 bit lines. Thus, each SAA contains M SAU electrically connected to M respective bit lines 982. The width WS of each SAA in the second horizontal direction hd2 is less than M×P, where P is the bit line pitch in the second horizontal direction (i.e., word line direction) hd2.

Thus, the width of the logic-side bit-line hookup region LBLHU along the second horizontal direction hd2 can be less than the width of the logic-side peripheral region LPERI along the second horizontal direction hd2, which can be the same as the width of the memory-side peripheral region MPERI along the second horizontal direction hd2. Each of the sense amplifier units SAU can be electrically connected to a respective one of the bit lines 982 in the memory die, i.e., the first semiconductor die 900, through the second bit-line hookup bonding pads 788C and the first bit-line hookup bonding pads 988C, which are a subset of bonding pads (988, 788) located at the bonding interface 800 and having an areal overlap with the sense amplifier region.

The logic-side power and control signal regions LPCS can be located adjacent to the logic-side peripheral region LPERI and the logic-side bit-line hookup region LBLHU. The logic-side power and control signal region LPCS can border the logic-side peripheral region LPERI, and can be laterally offset from the logic-side peripheral region LPERI along the first horizontal direction hd1. The logic-side power and control signal region LPCS can border the logic-side bit-line hookup region LBLHU, and can be laterally offset from the logic-side bit-line hookup region LBLHU along the second horizontal direction hd2. In one embodiment, the width of the logic-side power and control signal region LPCS along the second horizontal direction hd2 can be the same as the difference between the width of the logic-side peripheral region LPERI along the second horizontal direction hd2 and the width of the logic-side bit-line hookup region LBLHU along the second horizontal direction hd2. In other words, the sum of the width of the logic-side power and control signal region LPCS along the second horizontal direction hd2 and the width of the logic-side bit-line hookup region LBLHU along the second horizontal direction hd2 can be the same as the width of the logic-side peripheral region LPERI along the second horizontal direction hd2.

According to an aspect of the present disclosure, a combination of the logic-side bit-line hookup region LBLHU and the logic-side power and control signal region LPCS can fit within an area defined by the extensions of two lengthwise edges of the logic-side peripheral region LPERI that laterally extend along the first horizontal direction hd1. Further, the combination of the logic-side bit-line hookup region LBLHU and the logic-side power and control signal region LPCS can border the logic-side peripheral region LPERI on one side, and border a logic-side input-output region LIO on another side. The logic-side peripheral region LPERI can be laterally offset from the combination of the logic-side bit-line hookup region LBLHU and the logic-side power and control signal region LPCS along the first horizontal direction hd1, and the logic-side input-output region LIO can be laterally offset from the combination of the logic-side bit-line hookup region LBLHU and the logic-side power and control signal region LPCS along the first horizontal direction hd1.

Figure 5:
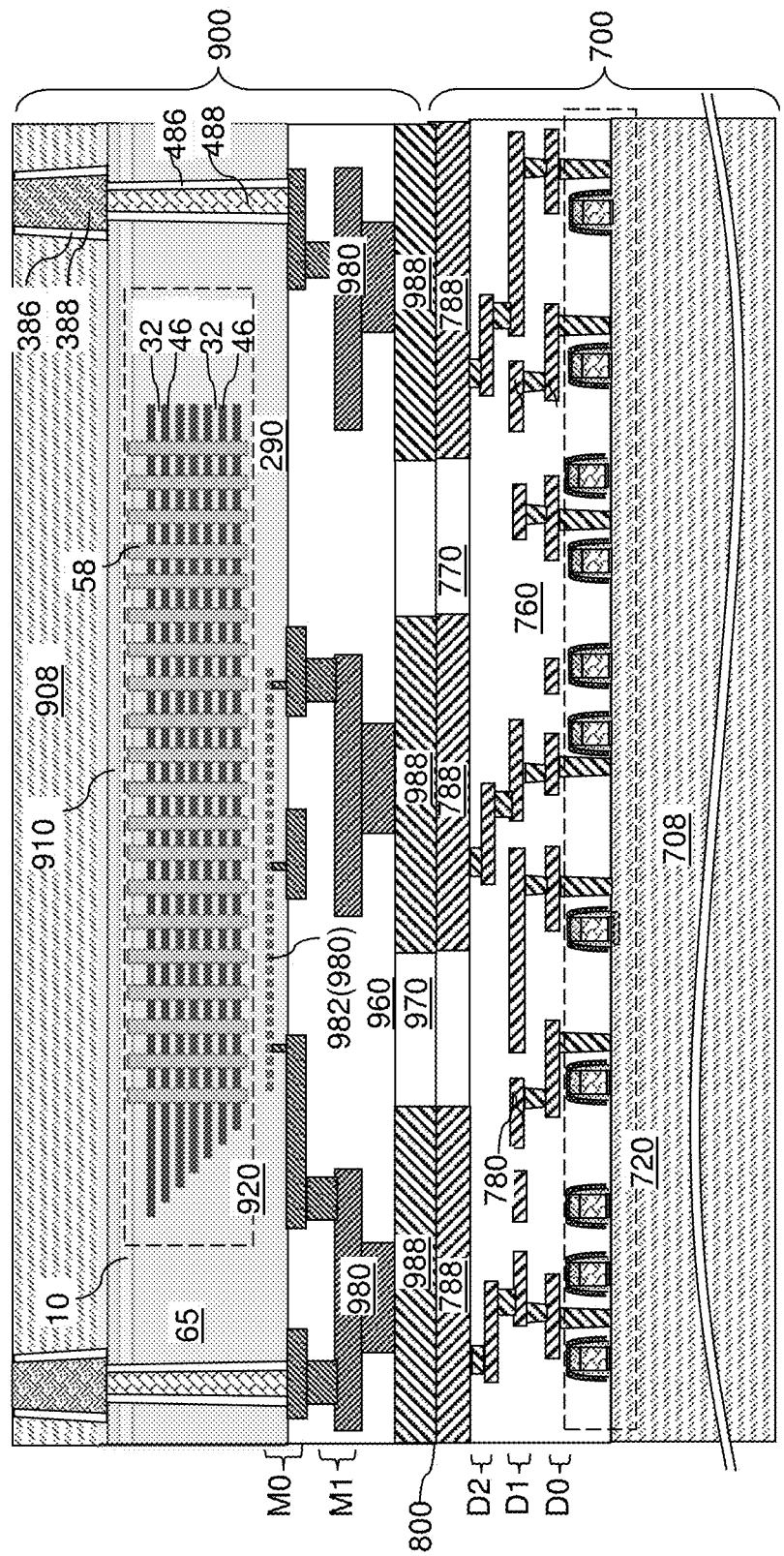
FIG. 5 is a vertical cross-sectional view of the bonded assembly after thinning the backside of a substrate within the memory die according to an embodiment of the present disclosure.

Referring to FIG. 5, the first substrate 908 may be thinned from the backside by grinding, polishing, an anisotropic etch, or an isotropic etch. The thinning process can continue until horizontal portions of the through-substrate liners 386 are removed, and horizontal surfaces of the through-substrate via structures 388 are physically removed. The thickness of the first substrate 908 after thinning can be in a range from 500 nm to 10,000 nm, although lesser and greater thicknesses can also be employed. Generally, end surfaces of the through-substrate via structures 388 can be physically exposed by thinning the backside of the first substrate 908, which may be the substrate of a memory die.

Figure 6:
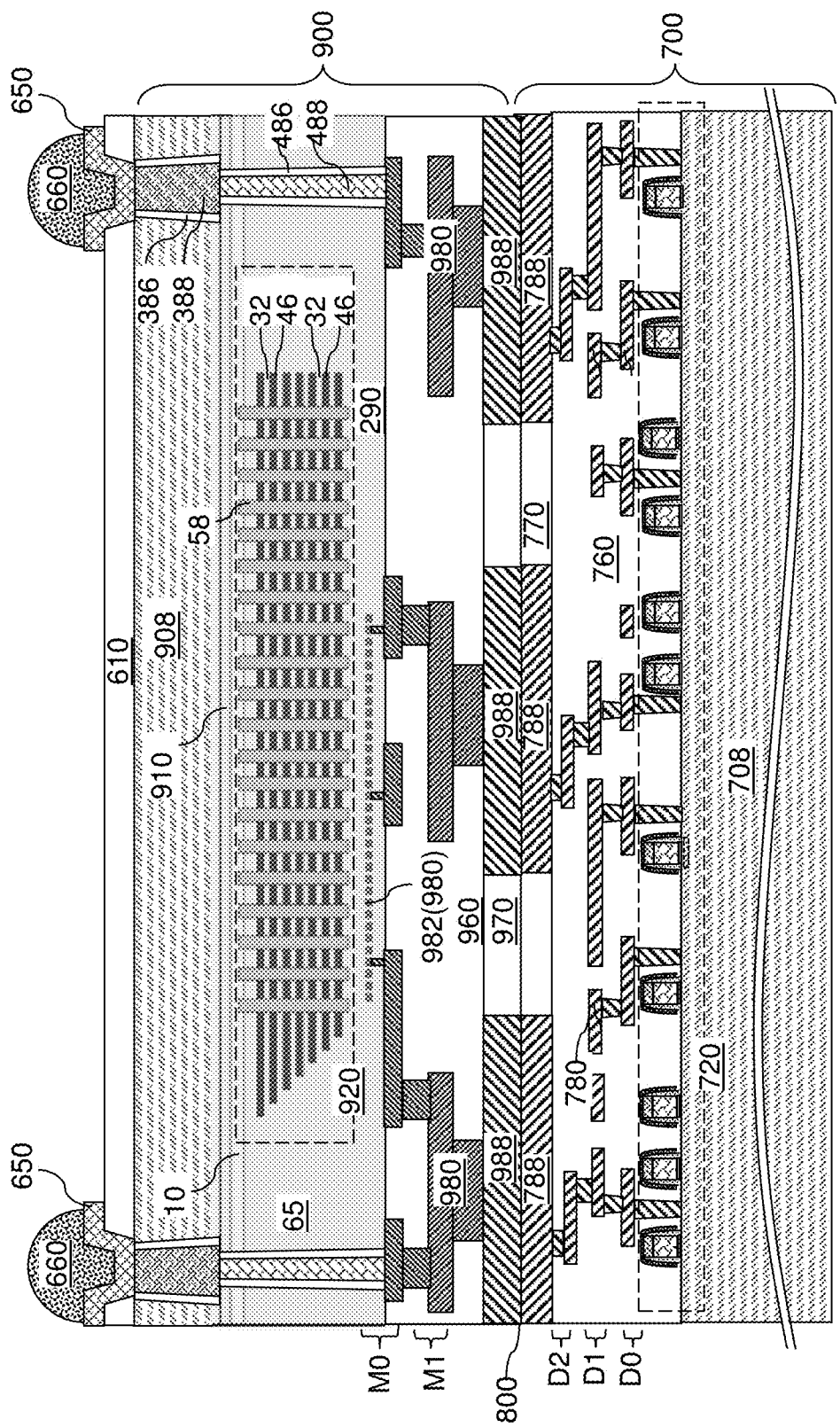
FIG. 6 is a vertical cross-sectional view of the bonded assembly after formation of a backside insulating layer, external bonding pads, and solder material portions according to an embodiment of the present disclosure.

Referring to FIG. 6, a backside insulating layer 610 may be formed on the backside of the first substrate 908. The backside insulating layer 610 includes an insulating material such as silicon oxide. The thickness of the backside insulating layer 610 can be in a range from 50 nm to 500 nm, although lesser and greater thicknesses can also be employed. A photoresist layer (not shown) may be applied over the backside insulating layer 610, and may be lithographically patterned to form opening over areas of the through-substrate via structures 388. An etch process can be performed to form via cavities through the backside insulating layer 610 underneath each opening in the photoresist layer. A top surface of a through-substrate via structure 388 can be physically exposed at the bottom of each via cavity through the backside insulating layer 610.

At least one metallic material can be deposited into the openings through the backside insulating layer 610 and over the planar surface of the backside insulating layer 610 to form a metallic material layer. The at least one metallic material can include copper, aluminum, ruthenium, cobalt, molybdenum, and/or any other metallic material that may be deposited by physical vapor deposition, chemical vapor deposition, electroplating, vacuum evaporation, or other deposition methods. For example, a metallic nitride liner material (such as TiN, TaN, or WN) may be deposited directly on the physically exposed surfaces of the through-substrate via structures 388, on sidewalls of the openings through the backside insulating layer 610, and over the physically exposed planar surface of the backside insulating layer 610. The thickness of the metallic nitride liner material can be in a range from 10 nm to 100 nm, although lesser and greater thicknesses can also be employed. At least one metallic fill material such as copper or aluminum can be deposited over the metallic nitride liner material. In one embodiment, the at least one metallic fill material can include a stack of a high-electrical-conductivity metal layer (such as a copper layer or an aluminum layer) and an underbump metallurgy (UBM) layer stack for bonding a solder ball thereupon. Exemplary UBM layer stacks include, but are not limited to, an Al/Ni/Au stack, an Al/Ni/Cu stack, a Cu/Ni/Au stack, a Cu/Ni/Pd stack, a Ti/Ni/Au stack, a Ti/Cu/Ni/Au stack, a Ti—W/Cu stack, a Cr/Cu stack, and a Cr/Cu/Ni stack. The thickness of the metallic material layer over the planar horizontal surface of the backside insulating layer 610 can be in a range from 0.5 microns to 10 microns, such as from 1 micron to 5 microns, although lesser and greater thicknesses can also be employed.

The at least one metallic fill material and the metallic material layer can be subsequently patterned to form discrete backside bonding pads 650 contacting a respective one of the through-substrate via structures 388. The backside bonding pads 650 can function as external bonding pads that can be employed to electrically connect various nodes of within the first semiconductor die 900 and the second semiconductor die 700 to external nodes, such as bonding pads on a packaging substrate or C4 bonding pads of another semiconductor die. For example, solder material portions 660 can be formed on the backside bonding pads 650, and a C4 bonding process or a wire bonding process can be performed to electrically connect the backside bonding pads 650 to external electrically active nodes.

Generally, backside bonding pads 650 can be formed on a backside surface of the first semiconductor die 900 (which may be a memory die) that is located on an opposite side of the bonding interface 800 between the first semiconductor die 900 and the second semiconductor die 700. Through-substrate via structures 388 can vertically extend through the first semiconductor die 900, and can provide electrical connection between the backside bonding pads 650 and a subset of the bonding pads (988, 788), which can include the first input-output bonding pads 988A and the second input-output bonding pads 788A.

Figure 7A:
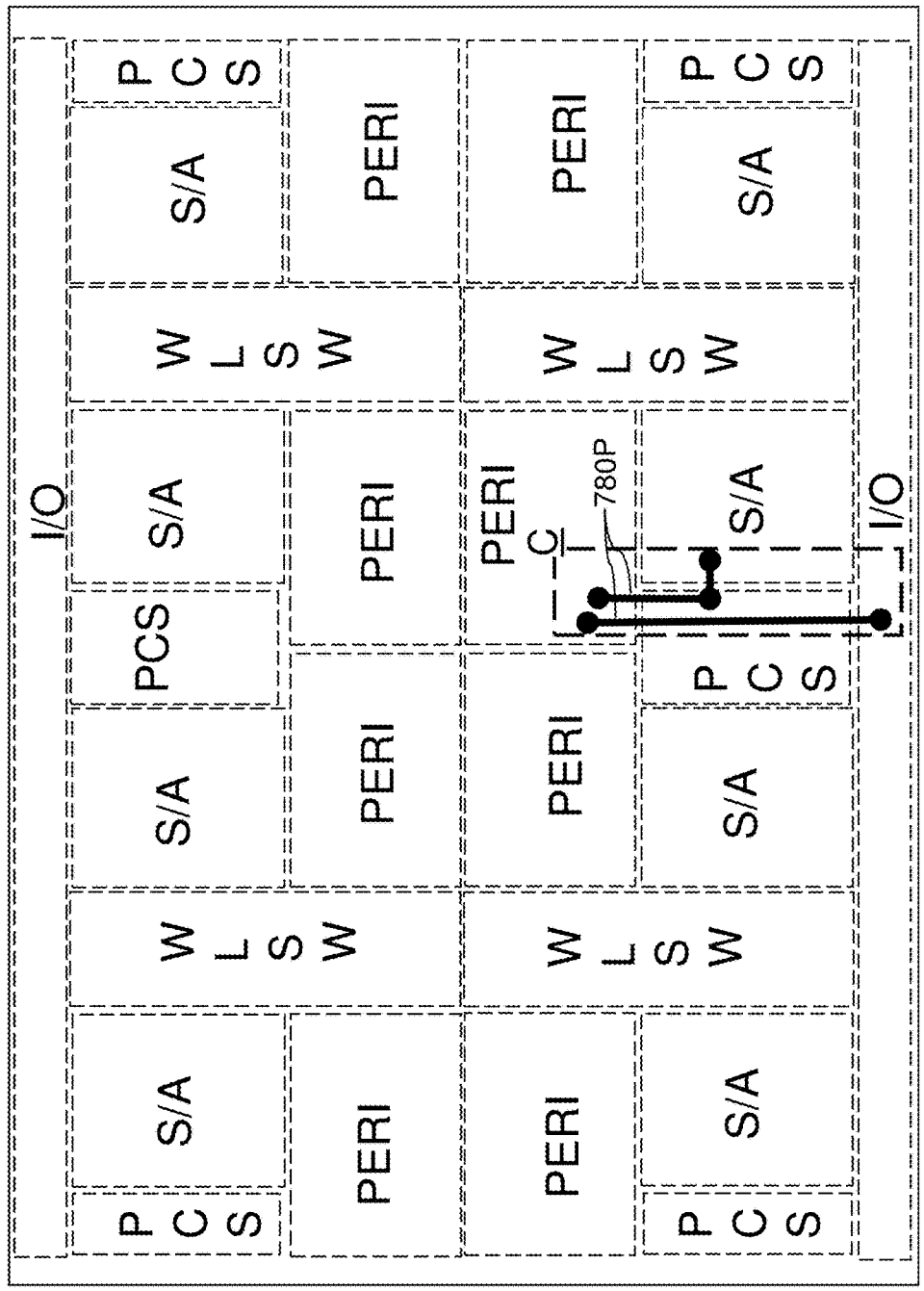
FIG. 7A is schematic horizontal cross-sectional view of the logic die within the bonded assembly of FIG. 6 according to a first embodiment of the present disclosure
Figure 7B:
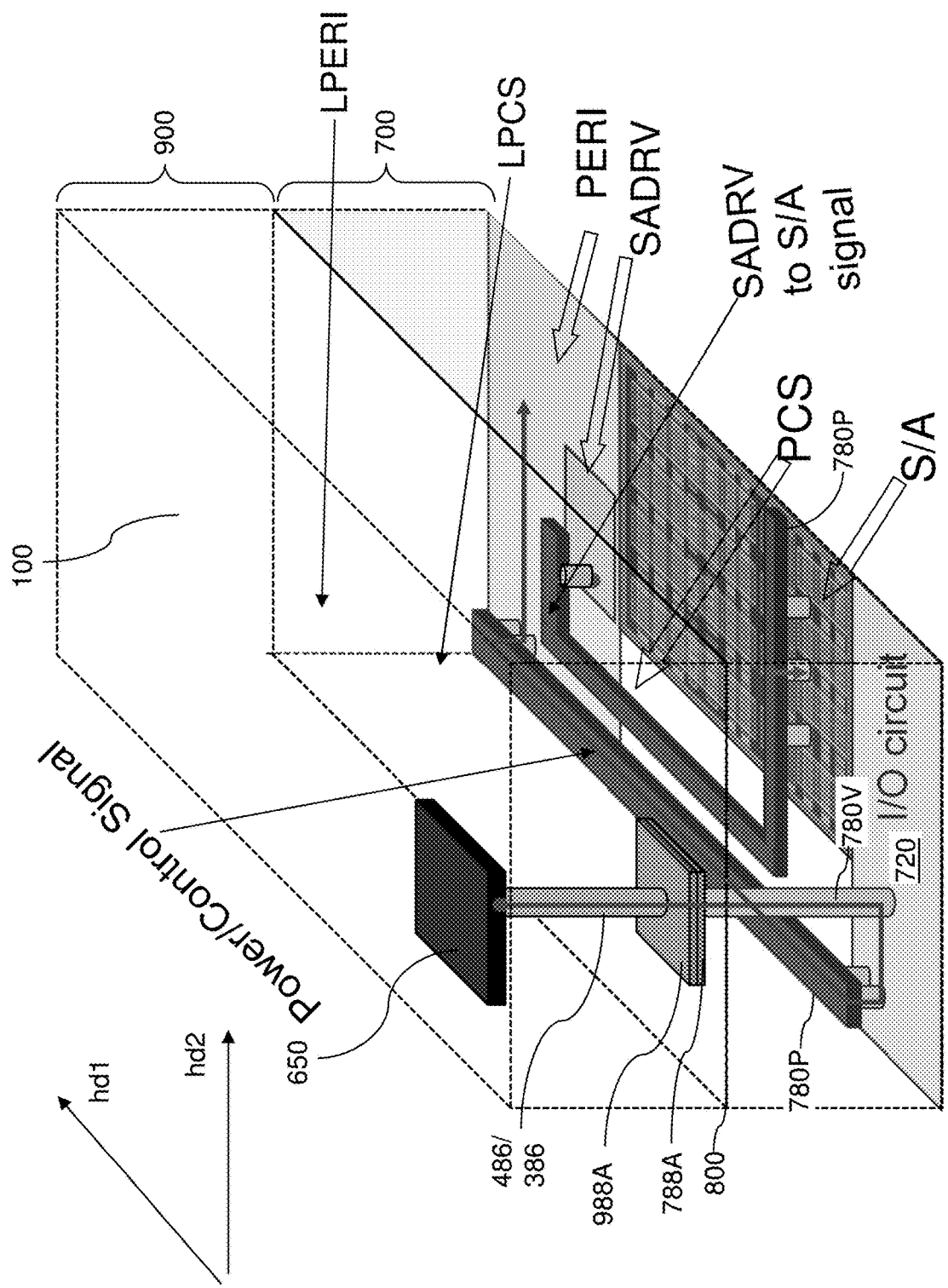
FIG. 7B is a perspective view of a portion of the logic die that includes the area B illustrated in FIG. 7A.

Referring to FIGS. 7A and 7B, spatial arrangements between a contiguous set of an input/output circuit I/O, a sense amplifier region S/A, a peripheral circuit region PERI containing the sense amplifier driver circuit (SADRV), and a set of power supply and control interconnect structures 780P in the power and signal connection region PCS in portion of the bonded assembly of FIG. 6 are illustrated. FIG. 7A is the same as FIG. 2B, except that FIG. 7A illustrates the location of region C shown in FIG. 7C. The volume of the second semiconductor die 700 below the area of the logic-side power and control signal region LPCS includes a set of power supply and control interconnect structures located in region PCS. The set of power supply and control interconnect structures 780P can include a subset of the second metal interconnect structures 780. The set of power supply and control interconnect structures 780P can be employed to route power supply voltages and control signals between the second semiconductor die 700 and the first semiconductor die 900 through the respective input/output bonding pads (988A, 788A). The power and control signal region PCS which contains vertical and lateral interconnects can be laterally bounded by the input-output circuit region I/O, by a sense amplifier region (S/A that is located below the logic-side bit-line hookup region LBLHU, and by the peripheral circuit region PERI which is located below the logic-side peripheral connection region LPERI between two sense amplifier regions S/A. A portion of an electrically conductive path from a sense amplifier driver circuit SADRV to a sense amplifier region S/A is schematically shown, and is labeled as "SADRV to S/A signal" A portion of a power connection path or a signal connection path from the pads 650 to the peripheral circuit region PERI is schematically illustrated, and is labeled as "Power/Control Signal."

Figure 8A:
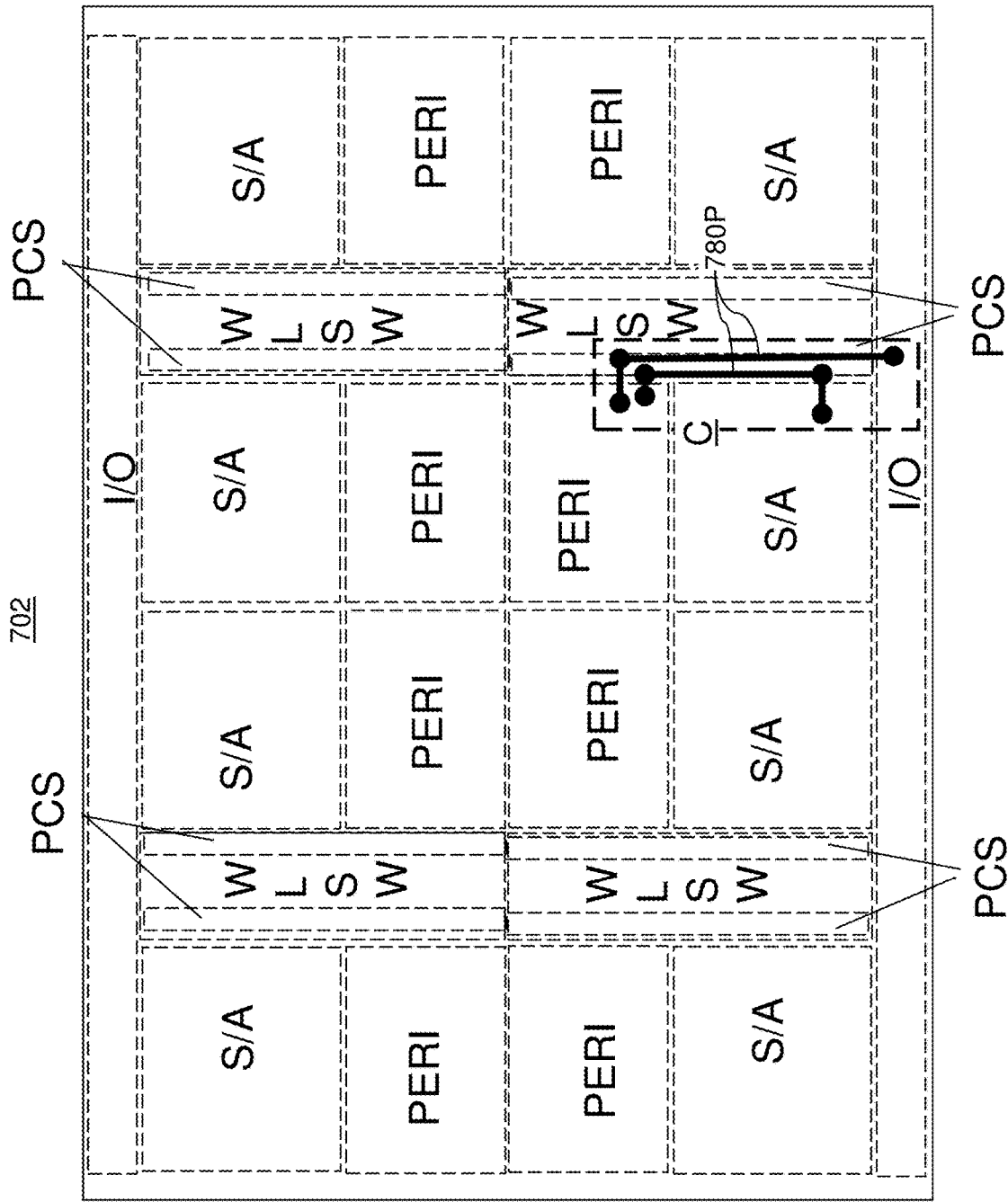
FIG. 8A is a schematic horizontal cross-sectional view a second configuration of the logic die according to a second embodiment of the present disclosure.
Figure 8B:
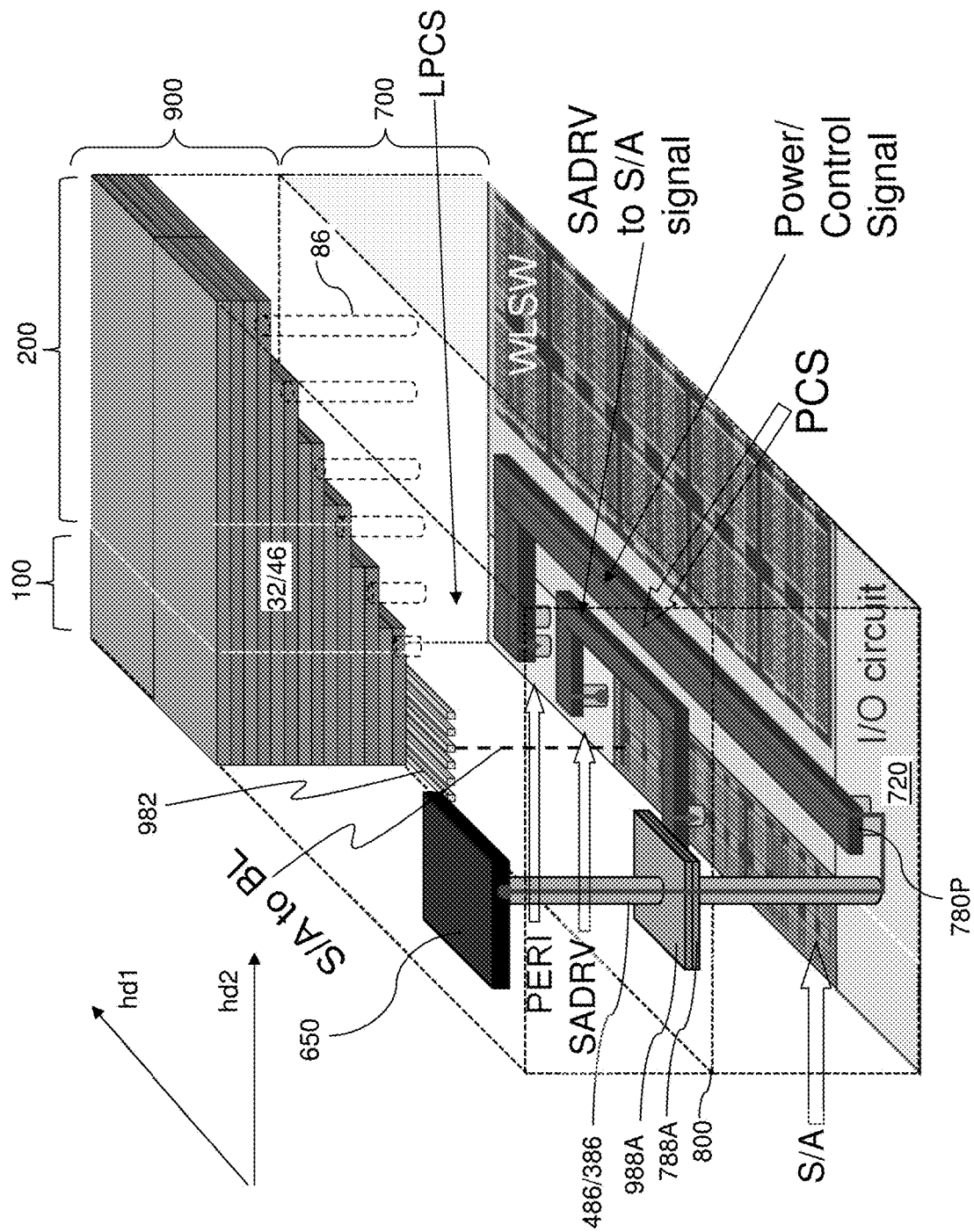
FIG. 8B is a perspective view of a portion of the logic die that includes the area C illustrated in FIG. 8A.

Referring to FIGS. 8A-8B, in a second embodiment, the power and control signal region PCS is located in a word line switch region WLSW adjacent to the sense amplifier region SA. Since the word line switch region WLSW in the logic die 700 may have a larger area than the staircase (i.e., terrace) region 200 in the memory die 900, part of the word line switch region WLSW may be occupied by the power and control signal region PCS. The alternative spatial arrangement between a contiguous set of an input/output circuit region I/O, a word line decoder in the including word line switch region WLSW, a sense amplifier region S/A, a peripheral circuit region PERI, and a set of power supply and control interconnect structures 780P in the power and control signal region PCS in a portion of the bonded assembly of FIG. 6 are illustrated in FIGS. 8A-8B.

The volume of the second semiconductor die 700 within the area of power and control signal region PCS located under the logic-side power and control signal region LPCS includes a set of power supply and control interconnect structures 780P. The set of power supply and control interconnect structures 780P can include a subset of the second metal interconnect structures 780. The set of power supply and control interconnect structures 780P can be employed to route power supply voltages and control signals between the second semiconductor die 700 and the first semiconductor die 900 through the respective input/output bonding pads (988A, 788A). The power and control signal region PCS can be laterally bounded by input-output circuit region I/O, by the sense amplifier region S/A, by the word line switch WLSW region and by the peripheral circuit region PERI. A portion of an electrically conductive path from a sense amplifier unit SAU to a bit line 782 is schematically shown, and is labeled as "S/A to BL" in FIG. 8B. A portion of a power connection path or a signal connection path between the first semiconductor die 900 and the second semiconductor die 700 is schematically illustrated, and is labeled as "Power/Control Signal." A portion of a power connection path or a signal connection path from region SADRV to region S/A is labeled SADRV to S/A signal. Layer contact via structures (e.g., word line contact via structures) 86 contacting the electrically conductive layers 46 (which can be word lines) and located in the memory die 900 are schematically illustrated.

Referring collectively to all figures and according to various embodiments of the present disclosure, a bonded assembly includes a memory die (such as the first semiconductor die 900) comprising a memory device 920 and a plurality of bit lines 982, and a logic die (such as the second semiconductor die 700) bonded to the memory die 900. The logic die 700 contains a control circuit 702 configured to control operation of the memory device 920. As shown in FIGS. 7A and 8A, the control circuit 702 comprises a peripheral circuit region PERI, a sense amplifier region S/A, and a power and control signal region PCS located adjacent to the sense amplifier region S/A, and containing at least one power and control signal interconnect structure 780P which is configured to provide a power or control signal to or from the peripheral circuit region PERI.

In one embodiment, the memory device 920 comprises a three-dimensional memory device. The three dimensional memory device comprises a memory array region 100 containing plurality of memory elements 54 arranged around a two-dimensional array of vertical semiconductor channels 60, drain regions 63 located at top portions of the respective semiconductor channels, and a plurality of word lines 46 extending in the second horizontal direction (e.g., word line direction) hd2. The bit lines 982 extend in the first horizontal direction (e.g., bit line direction) hd1 and are electrically connected to the respective drain regions 63.

In the first embodiment illustrated in FIGS. 4A, 4B, 7A and 7B, the peripheral circuit region PERI is located within an area that overlaps with an area of the memory array region 100 in a plan view along a direction that is perpendicular to a bonding interface 800 between the memory die 900 and the logic die 700. The sense amplifier region S/A is laterally offset from the peripheral circuit region PERI along the first horizontal direction hd1 and has a sense amplifier region width that is less than the memory array region 100 width, as shown in FIG. 4A. The power and control signal region PCS is laterally offset from the peripheral circuit region PERI along the first horizontal direction hd1 and laterally offset from the sense amplifier region S/A along the second horizontal direction, as shown in FIG. 7A. A subset of bonding pads (988A, 788A) shown in FIG. 7B is located at a bonding interface 800 between the memory die 900 and the logic die 700 and configured to transmit the power or control signals between the memory die 900 and the peripheral circuit region PERI through the power and control signal interconnection structure 780P. In one embodiment, the power and control signal interconnection structure 780P provides a vertical and horizontal electrical connection between the subset of bonding pads (988A, 788A) and the peripheral circuit region PERI.

In one embodiment, a width of the peripheral circuit region PERI along the second horizontal direction hd2 is the same as a sum of a width of the sense amplifier region S/A and a width of the power and control signal region PCS along the second horizontal direction, as shown in FIG. 7A.

In one embodiment shown in FIGS. 4A and 4B, the memory array region comprises L bit lines having a pitch P along the second horizontal direction hd2. The sense amplifier region S/A comprises N sense amplifier assemblies SAA arranged along the second horizontal direction hd2. Each of the sense amplifier assemblies SAA comprises M sense amplifier units SAU arranged along the first horizontal direction hd1. Each of the sense amplifier units SAU is electrically connected to a respective one of the L bit lines 982. The width of each sense amplifier assembly SAA in the second horizontal direction hd2 is less than a product of M and P, where L, M and N are positive integers and L=M×N. In one embodiment, the width each sense amplifier assembly SAA in the second horizontal direction hd2 is 40 to 90 percent of the product of M and P.

In one embodiment, each of the sense amplifier units SAU is electrically connected to a respective one of the bit lines 982 in the memory die 900 through another subset of bonding pads (988C, 788C) located at the bonding interface 800 and having an areal overlap with the sense amplifier region S/A.

In one embodiment, the control circuit 702 further comprises an input/output circuit region I/O located along an edge of the logic die 700. The subset of the bonding pads (988A, 788A) is located above the input/output circuit region I/O. The power and control signal region PCS is located between two sense amplifier regions S/A, and has a boundary that borders the peripheral circuit region PERI, the two sense amplifier regions S/A, and the input/output circuit region I/O, as shown in FIG. 7A. In one embodiment, the power and control signal interconnection structures 780P are electrically connected to the subset of bonding pads (988A, 788A,) through a metal via 780V in the input/output circuit region I/O, as shown in FIG. 7B.

In one embodiment shown in FIGS. 6 and 7B, the memory die 900 further comprises backside bonding pads 650 located on a backside surface of the memory die (i.e., on the backside of the substrate 908 of the memory die) 900 that is located on an opposite side of the bonding interface 800, and through-substrate via structures 388 vertically extend through the memory die 900 and provide electrical connection between the backside bonding pads 650 and the subset of the bonding pads (988A, 788A) through via structures 488. In some embodiments shown in FIGS. 7A, 7B, 8A and 8B, the power and control signal interconnection structures 780P further electrically connect the peripheral circuit region PERI and the sense amplifier region S/A.

In the second embodiment shown in FIGS. 8A and 8B, the control circuit 702 further comprises a word line switch region WLSW, and the power and control signal region PCS is located in the word line switch region WLSW adjacent to the sense amplifier region S/A. In one embodiment shown in FIG. 8B, the peripheral circuit region PERI is located within an area that overlaps with an area of the memory array region 100 in a plan view along a direction that is perpendicular to a bonding interface 800 between the memory die and the logic die. As shown in FIG. 8A, the sense amplifier region S/A is laterally offset from the peripheral circuit region PERI along the first horizontal direction hd1 and has a sense amplifier region width that is the same as the memory array region 100 width. The power and control signal region PCS is laterally offset from the peripheral circuit region PERI and the sense amplifier region S/A along the second horizontal direction hd2 and has a length along the first horizontal direction hd1 that is the same as a sum of a length of the peripheral circuit region PERI along the first horizontal direction and a length of the sense amplifier region S/A along the first horizontal direction.

In one embodiment shown in FIG. 8B, the memory die 900 comprises an alternating stack of insulating layers 32 and the word lines 46. All layers of the alternating stack are present within the memory array region 100. The word lines 46 have different lateral extents along the second horizontal direction hd2 that increase with a vertical distance from the bonding interface 800 in a staircase region 200 that is laterally offset from the memory array region 100 along the second horizontal direction hd2. At least a portion of the power and control signal region PCS has an areal overlap with the staircase region 200.

In one embodiment shown in FIG. 8B, the memory die 900 comprises word line contact via structures 86 that contact a respective one of the word lines 46 in the staircase region 200 and that extend toward the bonding interface 800. The control circuit 702 further comprises an input/output circuit region I/O located along an edge of the logic die 700. The power and control signal region PCS has a boundary that borders the peripheral circuit region PERI, the sense amplifier region S/A, and the input/output circuit region I/O.

In some embodiments shown in FIGS. 6, 7B and 8B, the memory die 900 further comprises backside bonding pads 650 located on a backside surface of the memory die 900 that is located on an opposite side of the bonding interface 800, and through-substrate via structures 388 vertically extend through the memory die and provide electrical connection between the backside bonding pads 650 and the subset of the bonding pads (988A, 788A).

In some embodiments, the method of operating the bonded assembly includes transmitting the power or control signals from the backside bonding pads 650 through the through-substrate via structures 388 (and through via structures 488), through a bonding pad 988A (and bonding pad 788A) and through the power and control signal interconnection structure 780P to the peripheral circuit region PERI. The method further comprises transmitting the power or control signals from the peripheral circuit region PERI through the power and control signal interconnection structure 780P to the sense amplifier region S/A.

The various embodiments of the present disclosure provide electrically conductive paths between power supply and control signal interconnect structures in a logic die and the memory die in a manner that while minimizing the total number of metal line levels in the bonded assembly of the logic die and the memory die. Particularly, the power supply and control interconnect structures are positioned adjacent to the sense amplifier region S/A and the horizontal portion of the electrical routing for the power supply voltage and control signals can be formed at the same level as the electrical wiring for providing signals to the bit lines and the word lines without requiring a separate fourth level of metallization in the logic die for providing such signals. The power supply and control interconnect structures can be distributed evenly across the logic die, thereby avoiding a centralized power bus or a control signal bus that extends across the entirety of the logic die or the memory die. In one embodiment, a total of five metal levels including a first memory-side metal level M0, a second memory-side metal level M1, a first logic-side metal level D0, a second logic-side metal level D1, and a third logic-side metal level D2 can be employed to distribute power supply voltages and control signals over a bonded assembly of a logic die and a memory die. Thus, the various embodiments of the present disclosure can be employed to provide efficient electrical wiring employing a lower number of metal levels for a bonded assembly of a logic die and a memory die.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

The invention claimed is:

1. A bonded assembly, comprising:
a memory die comprising a memory device and a plurality of bit lines; and
a logic die bonded to the memory die,
wherein:
the logic die contains a control circuit configured to control operation of the memory device;
the control circuit comprises a peripheral circuit region, a sense amplifier region, and a power and control signal region located adjacent to the sense amplifier region and containing at least one power and control signal interconnect structure which is configured to provide a power or control signal to or from the peripheral circuit region;
the memory device comprises a three-dimensional memory device;
the three dimensional memory device comprises a memory array region containing plurality of memory elements arranged around a two-dimensional array of vertical semiconductor channels, drain regions located at top portions of the respective semiconductor channels, and a plurality of word lines extending in the second horizontal direction;
the bit lines extend in the first horizontal direction and are electrically connected to the respective drain regions;
the peripheral circuit region is located within an area that overlaps with an area of the memory array region in a plan view along a direction that is perpendicular to a bonding interface between the memory die and the logic die;
the sense amplifier region is laterally offset from the peripheral circuit region along the first horizontal direction and has a sense amplifier region width that is less than the memory array region width;
the power and control signal region is laterally offset from the peripheral circuit region along the first horizontal direction and laterally offset from the sense amplifier region along the second horizontal direction;
a subset of bonding pads is located at a bonding interface between the memory die and the logic die and configured to transmit the power or control signals between the memory die and the peripheral circuit region through the power and control signal interconnection structure; and a width of the peripheral circuit region along the second horizontal direction is the same as a sum of a width of the sense amplifier region and a width of the power and control signal region along the second horizontal direction.

2. A bonded assembly, comprising:
a memory die comprising a memory device and a plurality of bit lines; and
a logic die bonded to the memory die,
wherein:
  the logic die contains a control circuit configured to control operation of the memory device;
  the control circuit comprises a peripheral circuit region, a sense amplifier region, and a power and control signal region located adjacent to the sense amplifier region and containing at least one power and control signal interconnect structure which is configured to provide a power or control signal to or from the peripheral circuit region;
  the memory device comprises a three-dimensional memory device;
  the three dimensional memory device comprises a memory array region containing plurality of memory elements arranged around a two-dimensional array of vertical semiconductor channels, drain regions located at top portions of the respective semiconductor channels, and a plurality of word lines extending in the second horizontal direction;
  the bit lines extend in the first horizontal direction and are electrically connected to the respective drain regions;
  the peripheral circuit region is located within an area that overlaps with an area of the memory array region in a plan view along a direction that is perpendicular to a bonding interface between the memory die and the logic die;
  the sense amplifier region is laterally offset from the peripheral circuit region along the first horizontal direction and has a sense amplifier region width that is less than the memory array region width;
  the power and control signal region is laterally offset from the peripheral circuit region along the first horizontal direction and laterally offset from the sense amplifier region along the second horizontal direction;
  a subset of bonding pads is located at a bonding interface between the memory die and the logic die and configured to transmit the power or control signals between the memory die and the peripheral circuit region through the power and control signal interconnection structure;
  the memory array region comprises L bit lines having a pitch P along the second horizontal direction;
  the sense amplifier region comprises N sense amplifier assemblies arranged along the second horizontal direction;
  each of the sense amplifier assemblies comprises M sense amplifier units arranged along the first horizontal direction;
  each of the sense amplifier units is electrically connected to a respective one of the L bit lines;
  the width each sense amplifier assembly in the second horizontal direction is less than a product of M and P; and
  L, M and N are positive integers where L=M×N.

3. The bonded assembly of claim 2, wherein the width of each sense amplifier assembly in the second horizontal direction is 40 to 90 percent of the product of M and P.

4. A bonded assembly of claim 3, wherein comprising:
a memory die comprising a memory device and a plurality of bit lines; and
a logic die bonded to the memory die,
wherein:
  the logic die contains a control circuit configured to control operation of the memory device;
  the control circuit comprises a peripheral circuit region, a sense amplifier region, and a power and control signal region located adjacent to the sense amplifier region and containing at least one power and control signal interconnect structure which is configured to provide a power or control signal to or from the peripheral circuit region;
  the memory device comprises a three-dimensional memory device;
  the three dimensional memory device comprises a memory array region containing plurality of memory elements arranged around a two-dimensional array of vertical semiconductor channels, drain regions located at top portions of the respective semiconductor channels, and a plurality of word lines extending in the second horizontal direction;
  the bit lines extend in the first horizontal direction and are electrically connected to the respective drain regions;
  the peripheral circuit region is located within an area that overlaps with an area of the memory array region in a plan view along a direction that is perpendicular to a bonding interface between the memory die and the logic die;
  the sense amplifier region is laterally offset from the peripheral circuit region along the first horizontal direction and has a sense amplifier region width that is less than the memory array region width;
  the power and control signal region is laterally offset from the peripheral circuit region along the first horizontal direction and laterally offset from the sense amplifier region along the second horizontal direction;
  a subset of bonding pads is located at a bonding interface between the memory die and the logic die and configured to transmit the power or control signals between the memory die and the peripheral circuit region through the power and control signal interconnection structure;
  the control circuit further comprises an input/output circuit region located along an edge of the logic die;
  the subset of the bonding pads is located above the input/output circuit region; and
  the power and control signal region is located between two sense amplifier regions, and has a boundary that borders the peripheral circuit region, the two sense amplifier regions, and the input/output circuit region.

5. The bonded assembly of claim 4, wherein the power and control signal interconnection structures are electrically connected to the subset of bonding pads through a metal via in the input/output circuit region.

6. The bonded assembly of claim 5, wherein the memory die further comprises:
  backside bonding pads located on a backside surface of the memory die that is located on an opposite side of the bonding interface; and through-substrate via structures vertically extending through the memory die and providing electrical connection between the backside bonding pads and the subset of the bonding pads.

7. A bonded assembly, comprising:
a memory die comprising a memory device and a plurality of bit lines; and
a logic die bonded to the memory die,
wherein:
- the logic die contains a control circuit configured to control operation of the memory device;
- the control circuit comprises a peripheral circuit region, a sense amplifier region, and a power and control signal region located adjacent to the sense amplifier region and containing at least one power and control signal interconnect structure which is configured to provide a power or control signal to or from the peripheral circuit region;
- the memory device comprises a three-dimensional memory device;
- the three dimensional memory device comprises a memory array region containing plurality of memory elements arranged around a two-dimensional array of vertical semiconductor channels, drain regions located at top portions of the respective semiconductor channels, and a plurality of word lines extending in the second horizontal direction;
- the bit lines extend in the first horizontal direction and are electrically connected to the respective drain regions;
- the control circuit further comprises a word line switch region;
- the power and control signal region is located in the word line switch region adjacent to the sense amplifier region;
- the peripheral circuit region is located within an area that overlaps with an area of the memory array region in a plan view along a direction that is perpendicular to a bonding interface between the memory die and the logic die;
- the sense amplifier region is laterally offset from the peripheral circuit region along the first horizontal direction and has a sense amplifier region width that is the same as the memory array region width; and
- the power and control signal region is laterally offset from the peripheral circuit region and the sense amplifier region along the second horizontal direction and has a length along the first horizontal direction that is the same as a sum of a length of the peripheral circuit region along the first horizontal direction and a length of the sense amplifier region along the first horizontal direction.

8. The bonded assembly of claim 7, wherein:
the memory die comprises an alternating stack of insulating layers and the word lines;
all layers of the alternating stack are present within the memory array region;
the word lines have different lateral extents along the second horizontal direction that increase with a vertical distance from the bonding interface in a staircase region that is laterally offset from the memory array region along the second horizontal direction; and
at least a portion of the power and control signal region has an areal overlap with the staircase region.

9. The bonded assembly of claim 8, wherein:
the memory die comprises word line contact via structures that contact a respective one of the word lines in the staircase region and that extend toward the bonding interface;
the control circuit comprises an input/output circuit region located along an edge of the logic die; and
the power and control signal region has a boundary that borders the peripheral circuit region, the sense amplifier region, and the input/output circuit region.

* * * * *